US008723588B2

(12) United States Patent
Kitsunezuka

(10) Patent No.: US 8,723,588 B2
(45) Date of Patent: May 13, 2014

(54) MIXER CIRCUIT AND VARIATION SUPPRESSING METHOD

(75) Inventor: Masaki Kitsunezuka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/508,513

(22) PCT Filed: Oct. 22, 2010

(86) PCT No.: PCT/JP2010/068730
§ 371 (c)(1),
(2), (4) Date: Sep. 4, 2012

(87) PCT Pub. No.: WO2011/058863
PCT Pub. Date: May 19, 2011

(65) Prior Publication Data
US 2013/0015901 A1    Jan. 17, 2013

(30) Foreign Application Priority Data
Nov. 11, 2009    (JP) .................. 2009-257795

(51) Int. Cl.
*G06G 7/12*    (2006.01)
*G06F 7/44*    (2006.01)
(52) U.S. Cl.
USPC .......................................... 327/356; 327/355
(58) Field of Classification Search
USPC ........................... 327/355–361; 455/323, 326
See application file for complete search history.

(56) References Cited

U.S. PATENT DOCUMENTS

| 6,121,819 | A  | * | 9/2000  | Traylor ......................... 327/359 |
| 7,227,482 | B2 |   | 6/2007  | San et al. |
| 7,346,327 | B2 | * | 3/2008  | Kawama et al. .............. 455/307 |
| 7,599,676 | B2 | * | 10/2009 | Maxim ......................... 455/258 |
| 7,689,189 | B2 | * | 3/2010  | De Ruijter ................... 455/213 |
| 7,890,076 | B2 | * | 2/2011  | Mattisson et al. ............ 455/323 |
| 8,520,785 | B2 | * | 8/2013  | He ................................ 375/350 |
| 2003/0071674 | A1 |  | 4/2003  | Kano |
| 2009/0111377 | A1 |  | 4/2009  | Mitomo et al. |

FOREIGN PATENT DOCUMENTS

| JP | 2003-60441  | A | 2/2003  |
| JP | 2006-352455 | A | 12/2006 |
| JP | 2008-118474 | A | 5/2008  |
| JP | 2009-111632 | A | 5/2009  |
| JP | 2009-159604 | A | 7/2009  |

* cited by examiner

*Primary Examiner* — Dinh T. Le
(74) *Attorney, Agent, or Firm* — McGinn IP Law Group, PLLC

(57) ABSTRACT

In a mixer circuit that solves the problem of the extreme increase in circuit complexity that accompanies compensating for amplitude errors and phase errors, a voltage current conversion unit (11) converts an RF signal, which is a voltage signal, to a current signal and supplies the current signal. An RF path selection unit (12) connects its input terminal to any of its output terminals in accordance with the state of a four-phase clock signal and separately supplies, from its output terminals, a plurality of IF signals obtained by multiplying the RF signal by clock signals in the four-phase clock signal. An IF path selection unit (13) switches the connection relationship between its input terminals and its output terminals in accordance with a selection signal (S) and supplies the IF signal input to each of its input terminals from its output terminals that are connected to the input terminals.

20 Claims, 30 Drawing Sheets

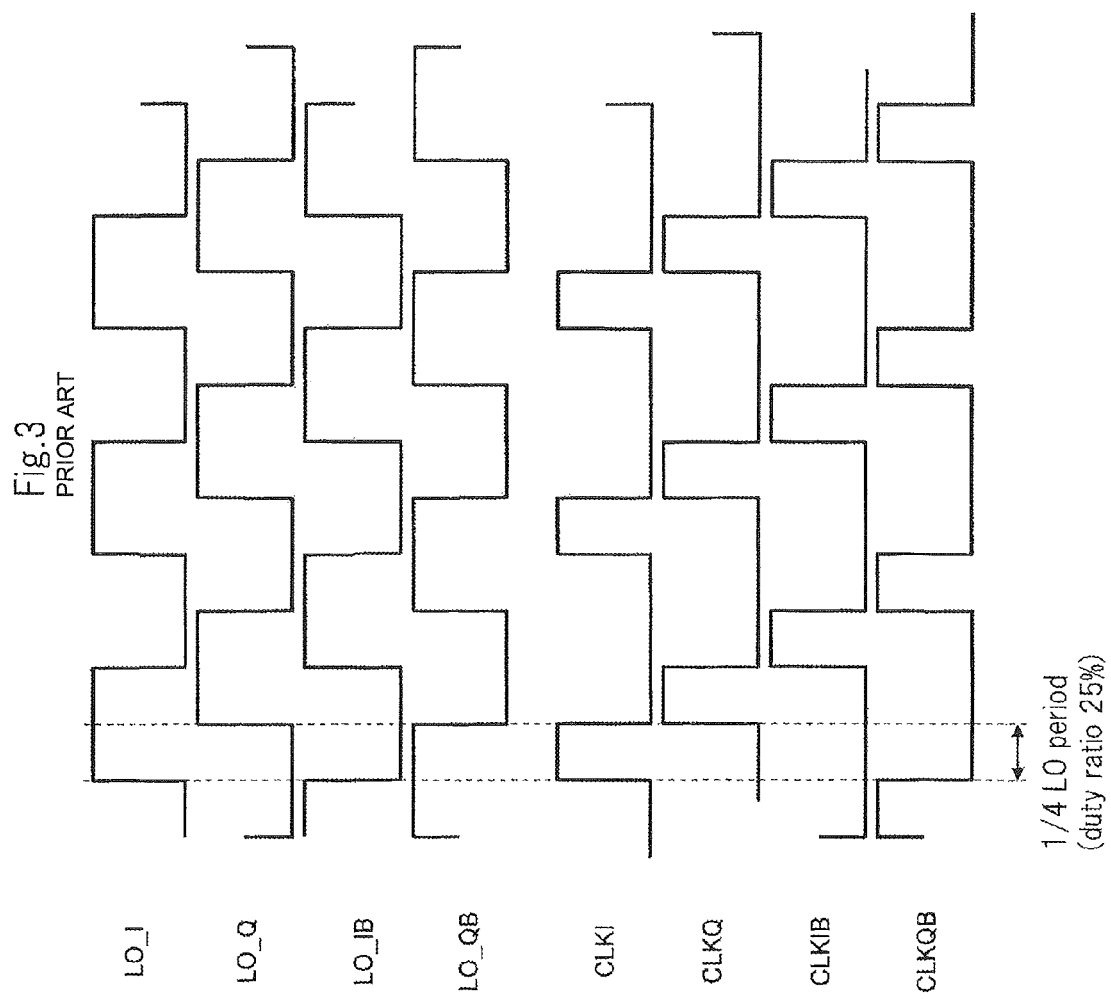

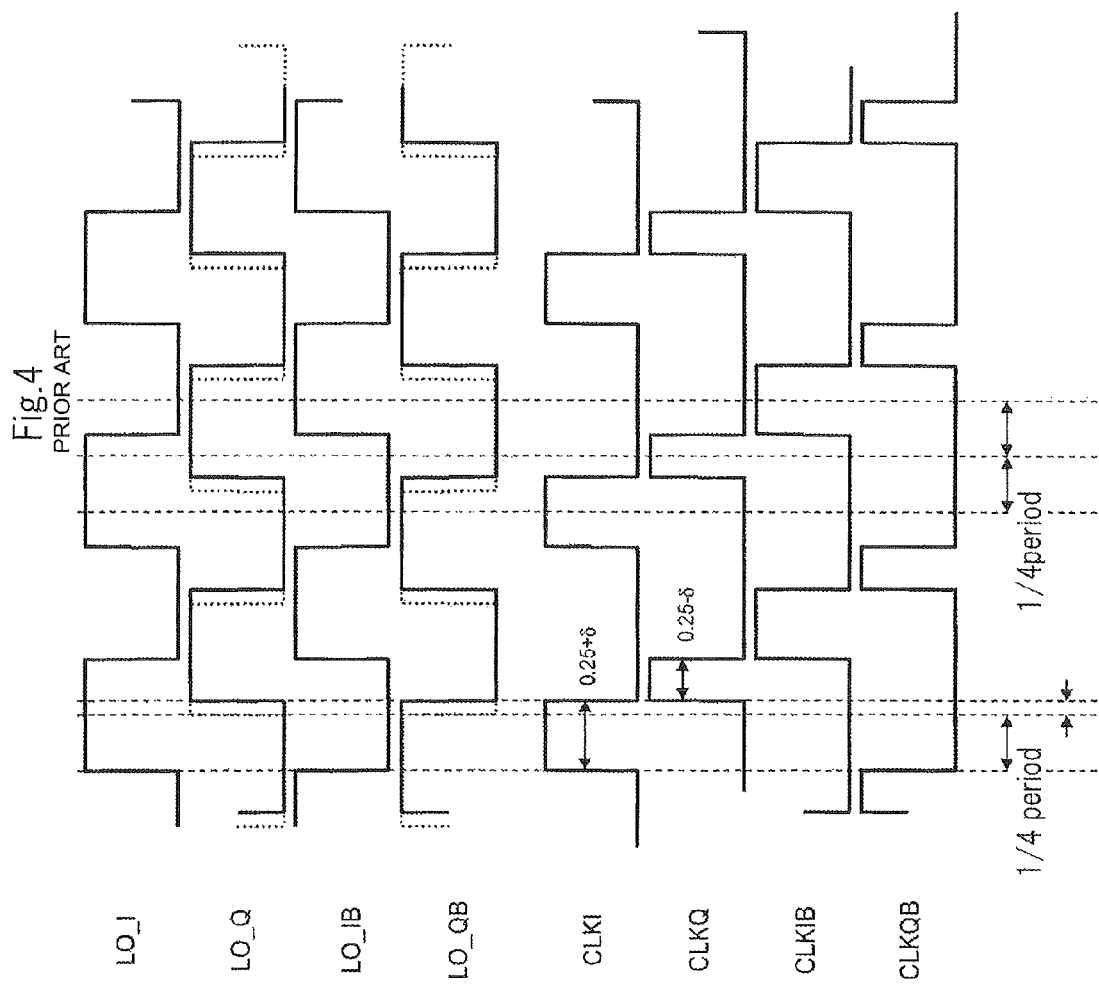

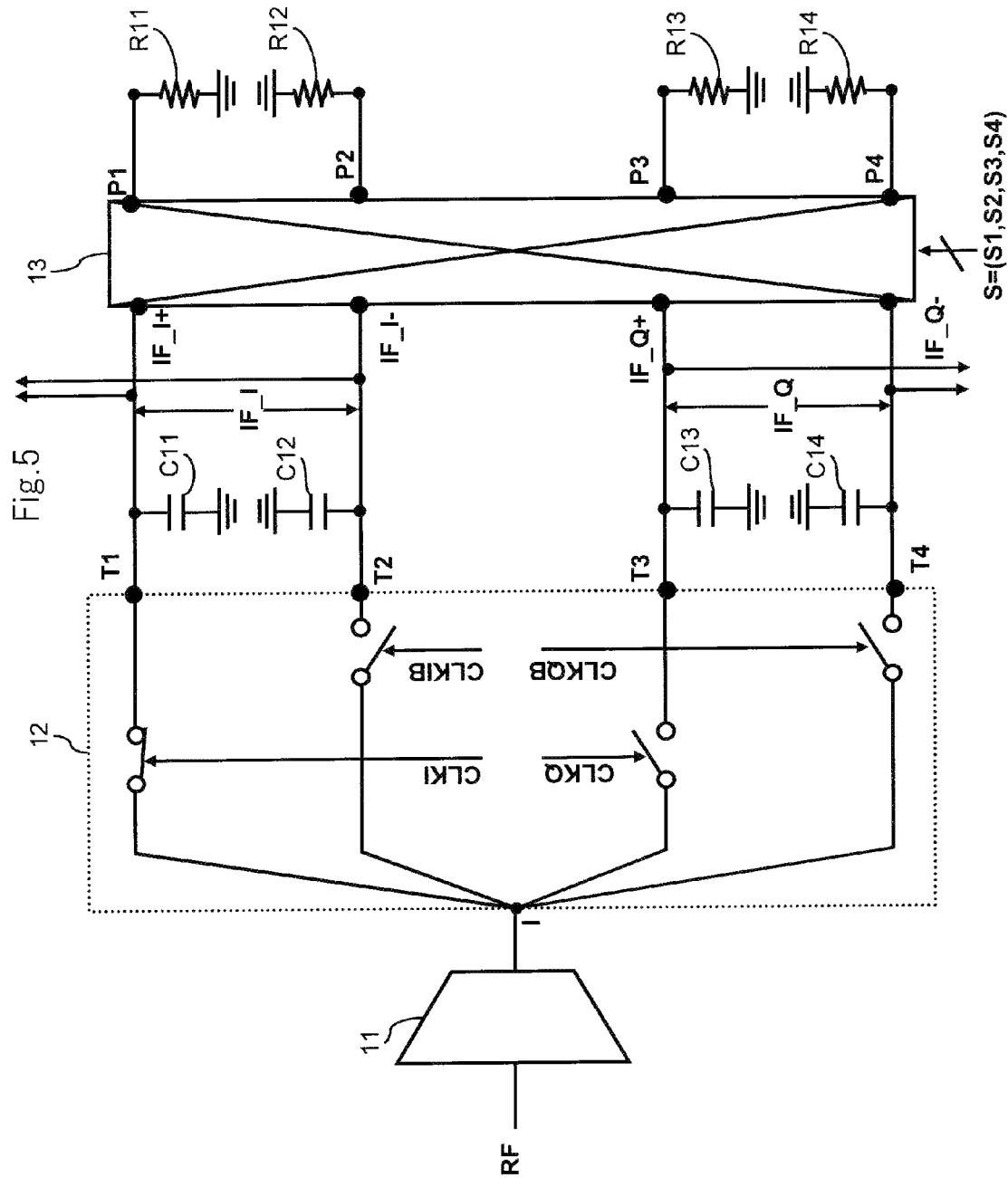

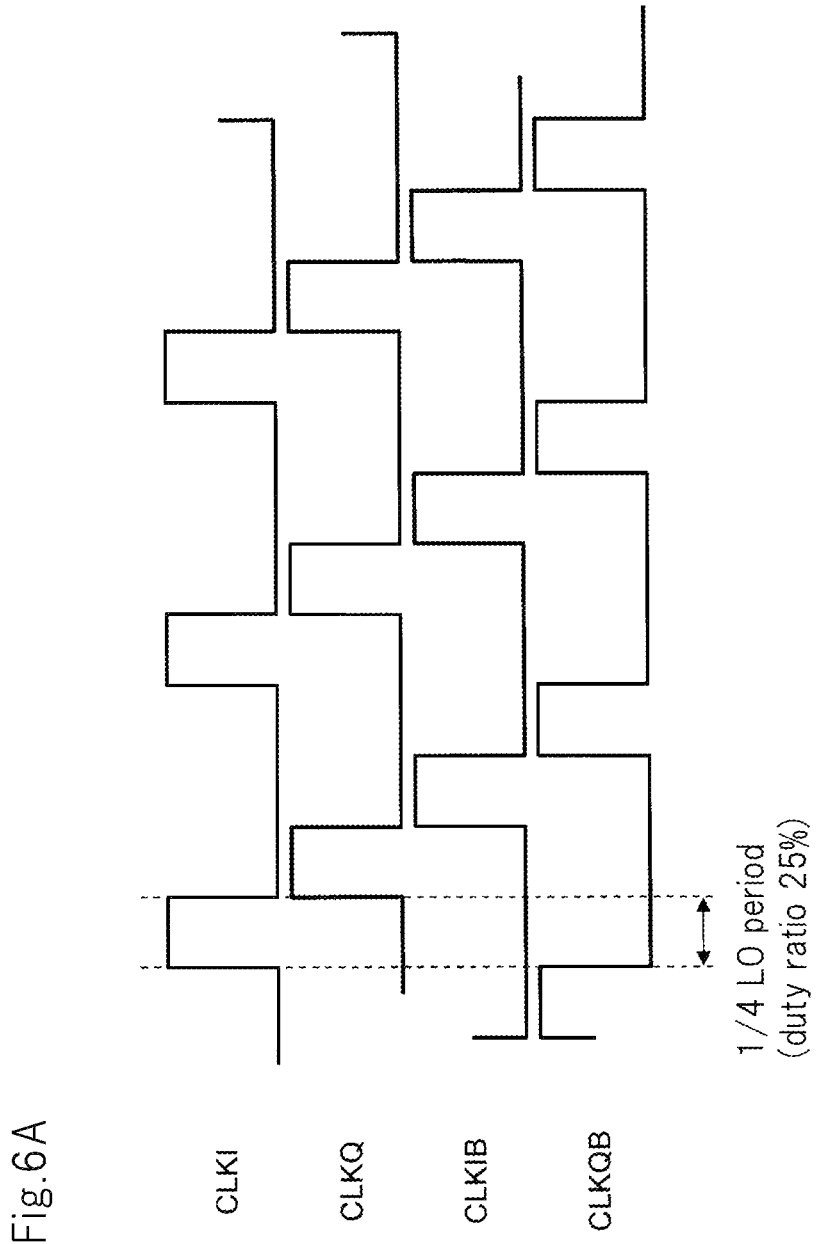

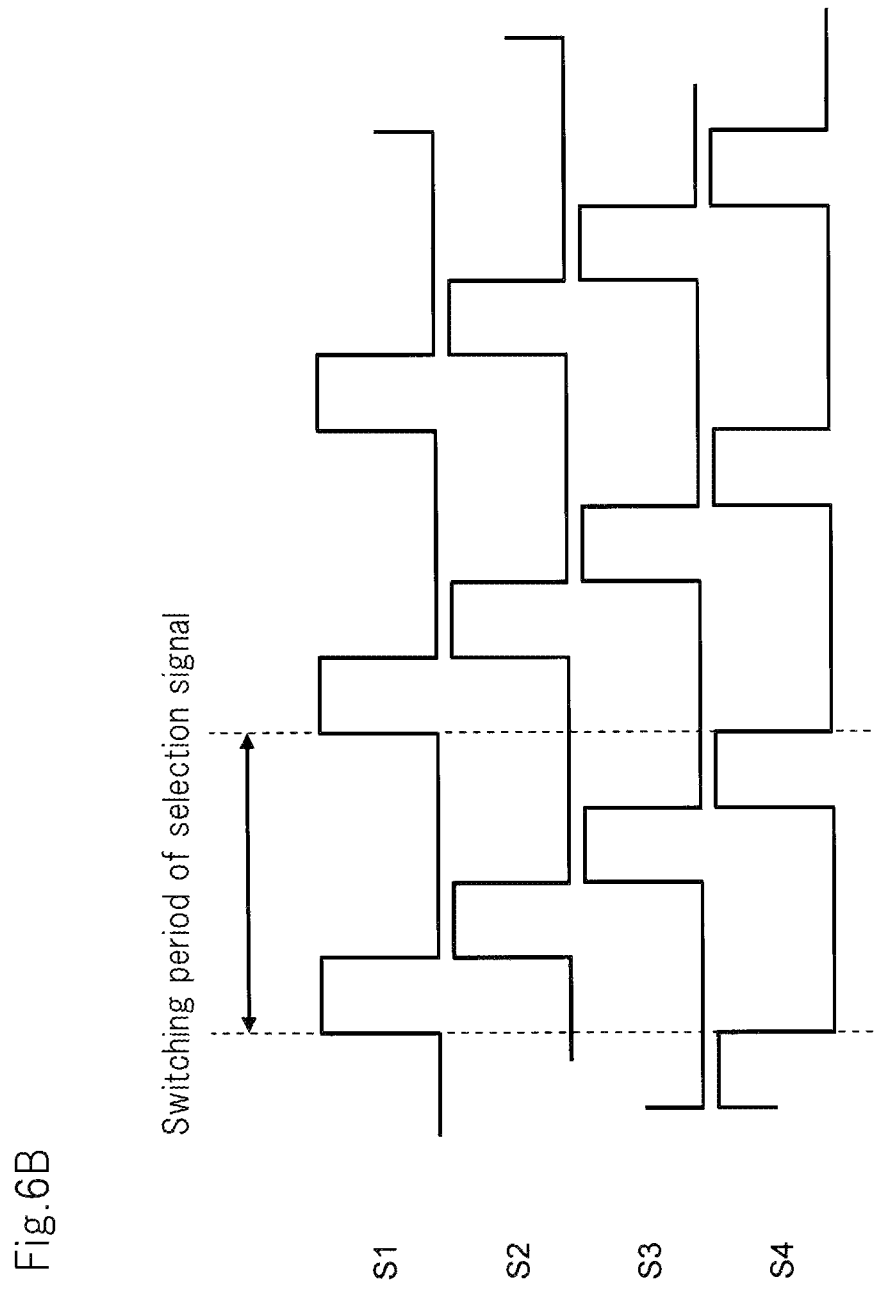

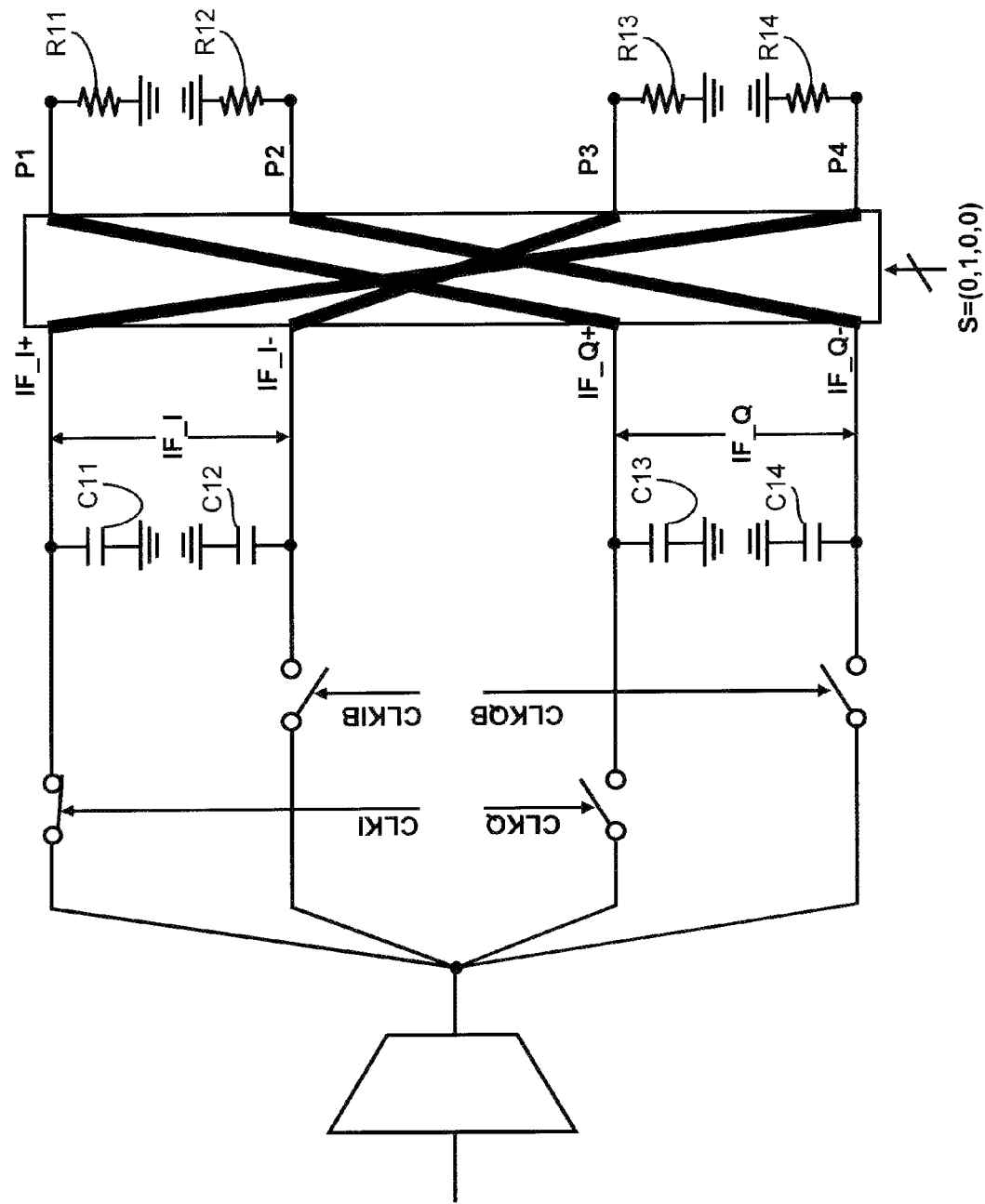

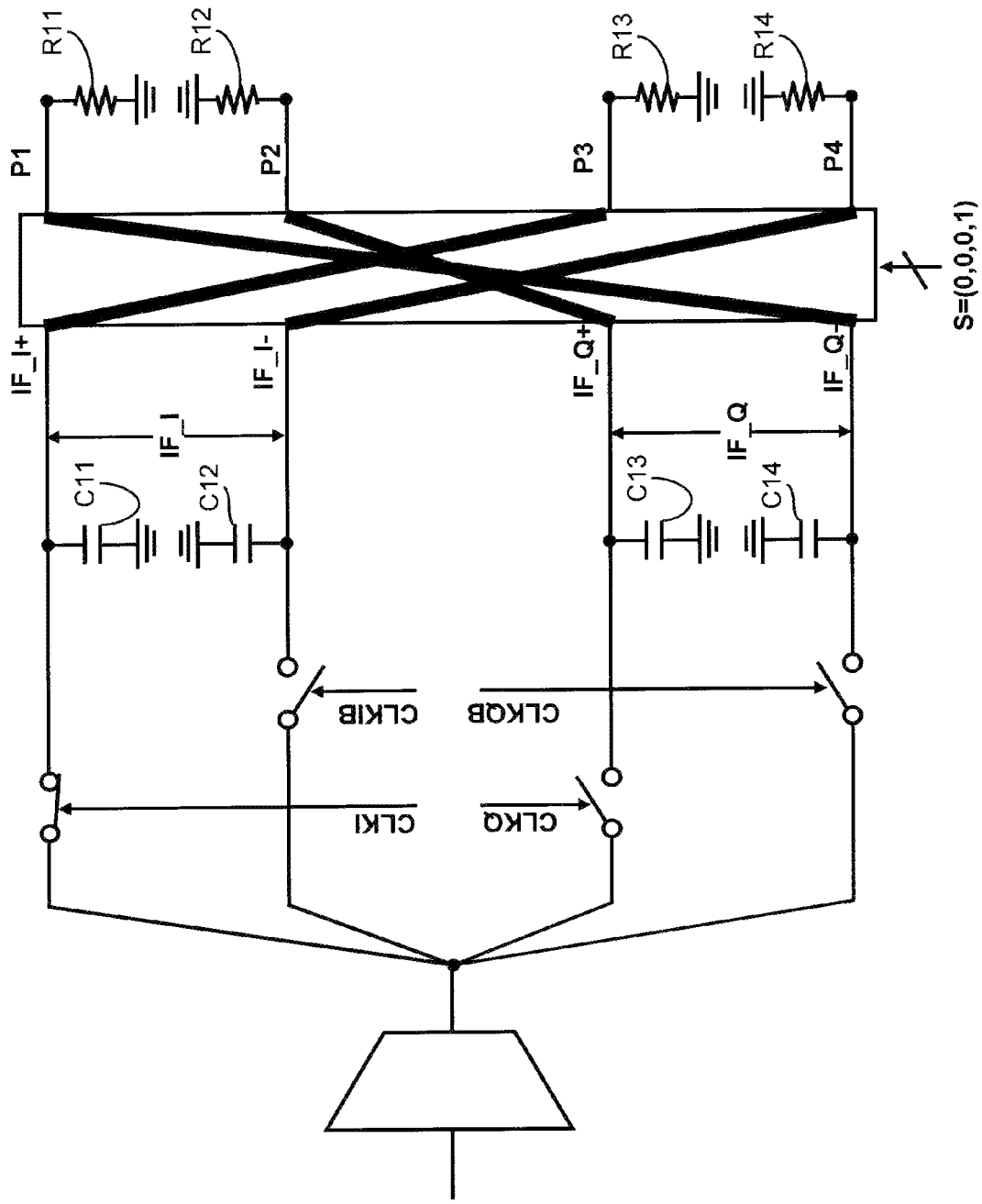

MIXER CIRCUIT AND VARIATION SUPPRESSING METHOD

TECHNICAL FIELD

The present invention relates to a mixer circuit that multiplies a plurality of signals and a method of suppressing variation, and more particularly to a mixer circuit that multiplies a plurality of signals to generate a plurality of signals that are orthogonal to each other and to a method of suppressing variation.

BACKGROUND ART

In radio communication systems in recent years, modulation modes that employ two mutually orthogonal baseband signals have come into use as a means of raising the efficiency of utilization of frequency. These two baseband signals are referred to as an I signal and a Q signal. Because the I signal and Q signal are modulated at the time of transmission, an orthogonal mixer circuit is required in the reception circuit for demodulating such that the I signal and Q signal are mutually orthogonal.

FIG. 1 is a circuit diagram showing an orthogonal mixer circuit of the related art of the present invention (for example, refer to Patent Document 1). FIG. 2 is a circuit diagram that gives an abstract representation of the orthogonal mixer circuit shown in FIG. 1. Constructions that correspond to each other in FIG. 1 and FIG. 2 are given the same reference numbers.

In addition, FIG. 3 is a timing chart showing the waveforms of LO signals that are the oscillation signals of a local oscillator (LO) belonging to a reception circuit and the waveforms of a four-phase clock signal that is generated from the LO signals.

The LO signals have a duty ratio of 50% and are made up from four signals having phases that each differ by 90 degrees (LO_I signal, LO_Q signal, LO_IB signal, and LO_QB signal). In addition, the four-phase clock signal has a duty ratio of 25% and is made up from four signals having phases that each differ by 90 degrees (CLKI signal, CLKQ signal, CLKIB signal, and CLKQB signal).

In FIGS. 1 and 2, the orthogonal mixer circuit includes voltage-current conversion unit 201, RF path selection unit 202, load capacitors C201-204, and load resistors R201-R204. Load capacitors C201 and C202 and load resistors R201 and R202 make up a first load block, and load capacitors C203 and C204 and load resistors R203 and R204 make up a second load block.

An RF signal received by the reception circuit is applied as input to voltage-current conversion unit 201. The RF signal is a differential voltage signal of the radio frequency (RF) band.

Voltage-current conversion unit 201 converts the RF signal that was received to a differential current signal and supplies the result to RF path selection unit 202.

RF path selection unit 202 supplies the RF signal that was supplied from voltage-current conversion unit 201 to the first load block or the second load block according to the state of the four-phase clock signal. The RF signal is thus multiplied by the four-phase clock signal and an I signal and Q signal that are differential current signals of the intermediate frequency (IF) band. The I signal and Q signal are converted to differential voltage signals in load resistors R201-R204 and supplied as output.

Because the output destination of the RF signal is thus altered according to the state of the four-phase clock signal, the simultaneous flow of the I signal and Q signal through voltage-current conversion unit 201 is eliminated. Accordingly, the voltage-current conversion unit for use by the I signal and the voltage-current conversion unit for use by the Q signal can be shared.

When a voltage-current conversion unit for use by the I signal and a voltage-current conversion unit for use by the Q signal are separately provided, the problem arises that error occurs in the amplitudes of the I signal and the Q signal when there is variation in conversion gain between the voltage-current conversion units. The orthogonal mixer circuit shown in FIG. 1 and FIG. 2 is able to provide a solution to the above-described problem because the voltage-current conversion unit for use by the I signal and the voltage-current conversion unit for use by the Q signal can be shared.

In addition, despite divergences of the 90-degree phase difference between the LO_I signal and LO_Q signal, the phases of the four-phase clock signal that are generated by using these signals are characterized by having accurate 90-degree phase differences, as shown in FIG. 4. As a result, the use of a four-phase clock signal enables the generation of I signals and Q signals that are accurately orthogonal.

LITERATURE OF THE PRIOR ART

Patent Documents

Patent Document 1: Japanese Unexamined Patent Application Publication No. 2003-060441

SUMMARY OF THE INVENTION

Problem to be Solved by the Invention

The problem arises that when variation occurs in load resistors R201-R204 for converting the I signal and Q signal to differential voltage signals in the orthogonal mixer circuit shown in FIG. 1 and FIG. 2, amplitude errors occur in the I signal and Q signal. In addition, the problem further arises that when variation occurs in load resistors R201-R204, variations occur in the time constant that is determined by load capacitors C201-C204 and load resistors R201-R204 in the I signal path and the Q signal path, whereby phase errors occur in the I signal and Q signal.

The amplitude errors and phase errors of the I signal and Q signal can be compensated by adjusting the values of load resistors R201-R204 according to these amplitude errors and phase errors. In this case, however, a capability for variability must be provided in load resistors R201-R204. Still further, a compensating system is necessary in the orthogonal mixer circuit for detecting amplitude errors and phase errors and for carrying out calibration by adjusting the values according to the detection results.

The problem therefore arises that when compensation of the amplitude errors and phase errors of the I signal and Q signal is implemented by adjusting the values of load resistors R201-R204, a capability for variability and a compensation system become necessary, resulting in extreme complexity of the orthogonal mixer circuit.

The additional problem arises that, because amplitude errors and phase errors are ordinarily minute, long-term integration must be implemented to detect the amplitude errors and phase errors and considerable time is expended in adjustment.

Still further, due to the influence of, for example, changes of temperature or power-supply voltage, changes occur in the circuit characteristics of the orthogonal mixer circuit whereby the values of load resistors R201-R204 change. In such cases, amplitude errors and phase errors of the I signal and Q signal will change over time. The problem therefore arises that compensating errors of this type necessitates the implementation of periodic calibration and a consequent increase in the number of test procedures and power consumption.

The above-described problems occur not only in an orthogonal mixer circuit, but also in a typical mixer circuit.

It is therefore an object of the present invention to provide a mixer circuit that can solve the problem described hereinabove, i.e., the problem of extreme circuit complexity for compensating amplitude errors and phase errors.

Means for Solving the Problem

The mixer circuit according to the present invention includes:
  a voltage-current conversion unit that converts a first signal that is a voltage signal to a current signal and supplies the resulting current signal as output;
  a first path selector that includes a first input terminal to which is applied as input the first signal that was supplied from the voltage-current conversion unit and a plurality of first output terminals, that switches the connection relationship among the first input terminal and the first output terminals in accordance with the state of a signal group that includes a plurality of second signals that are multiplied by the first signal, and that supplies, separately from each first output terminal, a plurality of third signals obtained by multiplying each of the second signals by the first signal;
  a second path selector that includes a plurality of second input terminals to which each of the third signals is applied and a plurality of second output terminals, that switches the connection relationship among the second input terminals and the second output terminals in accordance with the state of a fourth signal that switches the connection relationship of the second input terminals and the second output terminals, and that supplies the third signals that were applied as input to each of second input terminals from the second output terminals that are connected to the second input terminals;
    a first load unit that is connected to the first output terminals for smoothing the third signals; and a second load unit that is connected to the second output terminals for converting the third signals to voltage signals.

The variation suppressing method according to the present invention is a variation suppressing method realized by a mixer circuit that includes: a voltage-current conversion unit that converts a first signal that is a voltage signal to a current signal and supplies the resulting current signal as output; a first path selector that includes a first input terminal to which is applied as input the first signal that is supplied from the voltage-current conversion unit and first output terminals that supply a plurality of third signals obtained by multiplying each of a plurality of second signals by the first signal; a second path selector that has a plurality of second input terminals to which are applied each of the third signals and a plurality of second output terminal; a first load unit that is connected to the first output terminals for smoothing the third signals; and a second load unit that is connected to the second output terminals for converting the third signals to voltage signals; the variation suppressing method including:
  a first switching step of switching the connection relationship among the first input terminal and the first output terminals in accordance with the state of a signal group that includes the plurality of second signals and supplying, separately from each first output terminal, a plurality of third signals obtained by multiplying each of the second signals by the first signal; and
  a second switching step of switching the connection relationship among the second input terminals and the second output terminals in accordance with the state of a fourth signal that switches the connection relationship among the second input terminals and the second output terminals and supplying third signals that were received as input in each of second input terminals from the second output terminals that are connected to the second input terminals.

Effect of the Invention

The present invention enables the compensation of amplitude errors and phase errors while reducing the increase in complexity of the circuit.

BRIEF DESCRIPTION OF THE DRAWINGS

FIG. 3 is a timing chart showing the waveforms used in the orthogonal mixer circuit shown in FIG. 1.

FIG. 4 is a view for describing the features of the orthogonal mixer circuit shown in FIG. 1.

FIG. 5 is a circuit diagram showing the configuration of the orthogonal mixer circuit of the first exemplary embodiment.

FIG. 6A is a timing chart showing a four-phase clock signal.

FIG. 6B is a timing chart showing a selection signal.

FIG. 7B is a view for describing an example of the operation of an IF path selection unit.

FIG. 7D is a view for describing an example of the operation of an IF path selection unit.

BEST MODE FOR CARRYING OUT THE INVENTION

Figure 1:
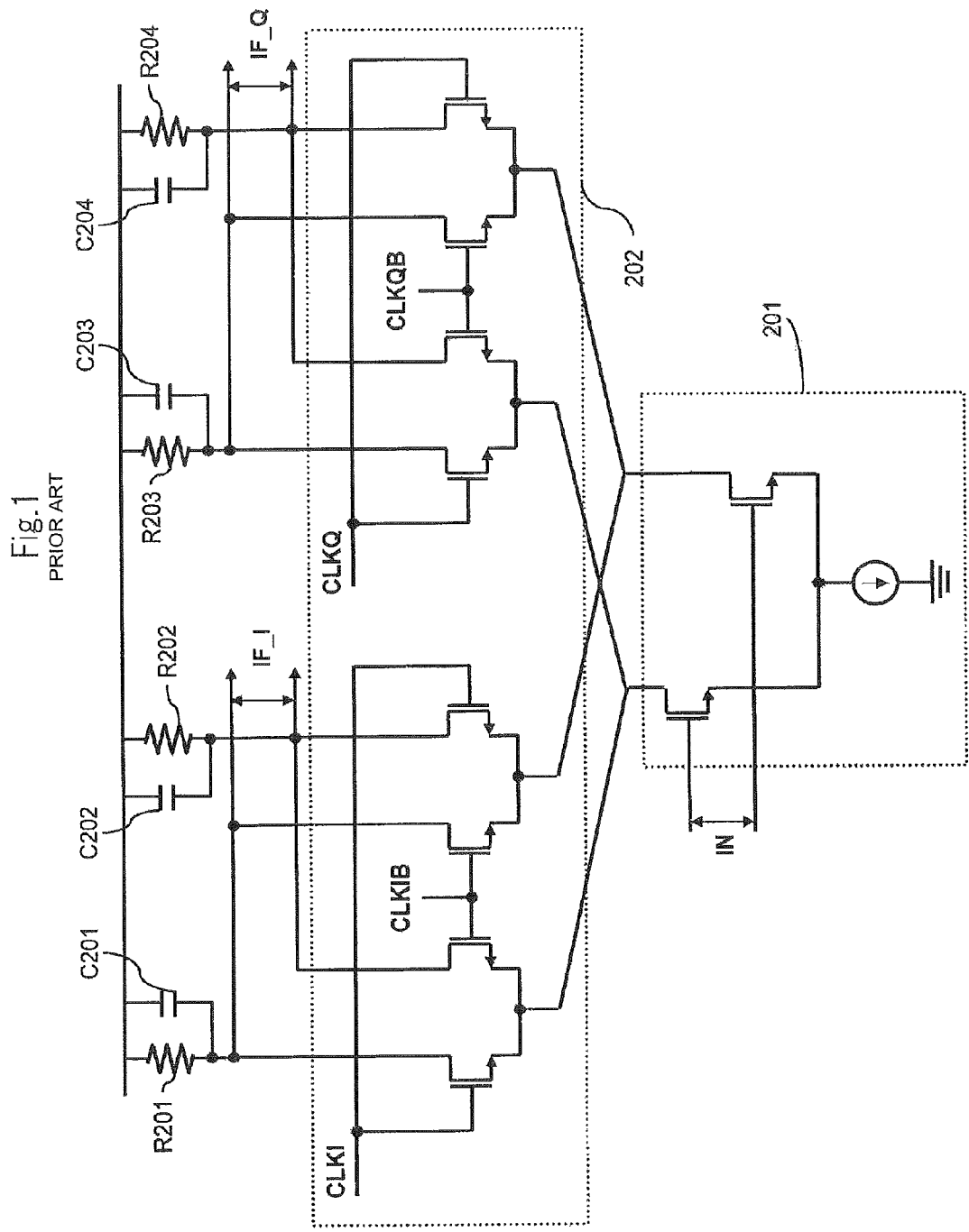
FIG. 1 is a circuit diagram showing an orthogonal mixer circuit that is the related art of the present invention.
Figure 2:
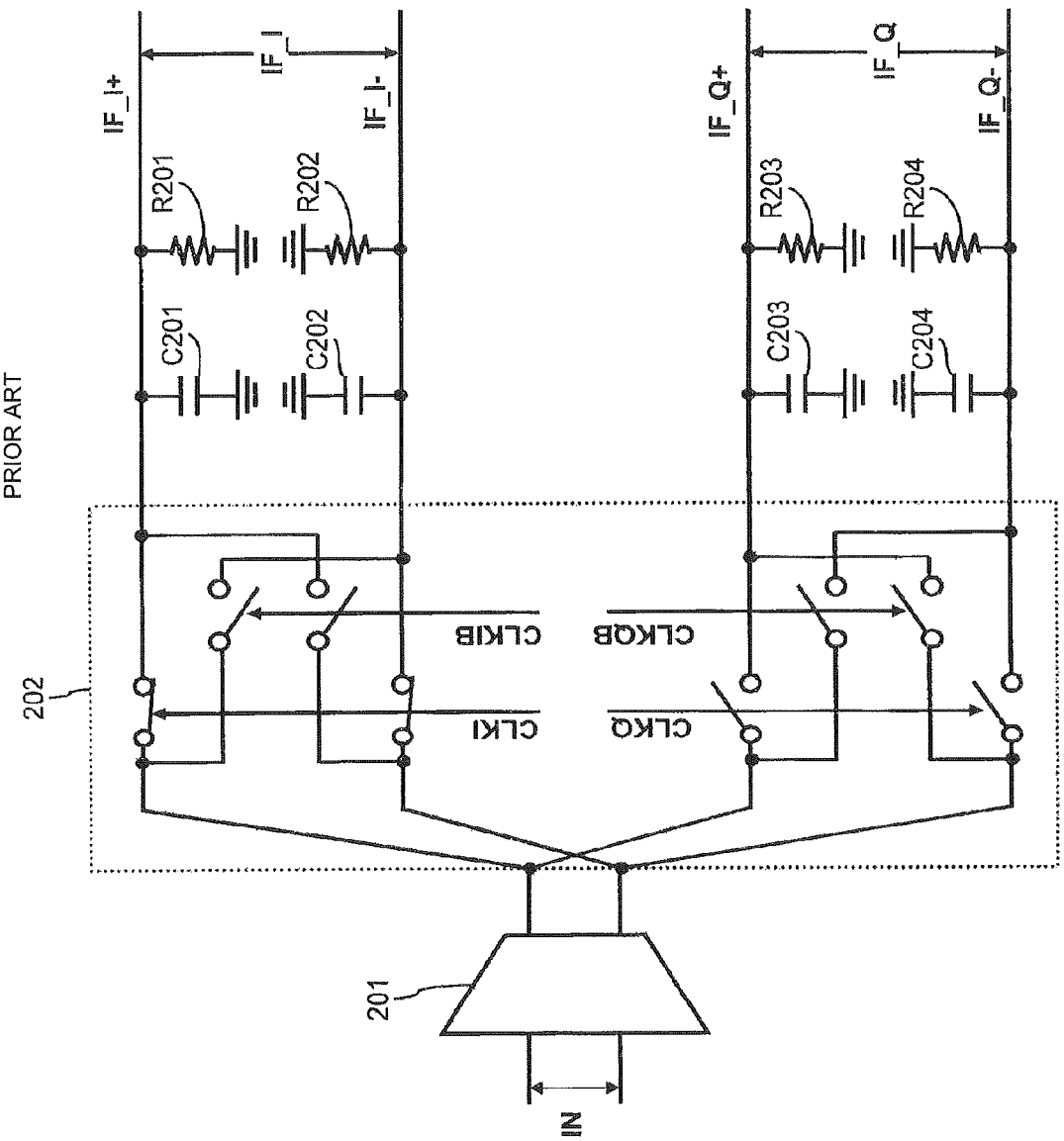
FIG. 2 is a circuit diagram giving an abstract representation of the orthogonal mixer circuit shown in FIG. 1.

Exemplary embodiments of the present invention are next described with reference to the accompanying drawings. In the following explanation, constructions having the same function are given the same reference numbers and redundant explanation may be omitted.

FIG. 5 is a circuit diagram showing the configuration of the orthogonal mixer circuit of the first exemplary embodiment of the present invention. In FIG. 5, the orthogonal mixer circuit includes: voltage-current conversion unit 11, RF path selection unit 12, IF path selection unit 13, load resistors R11-R14, and load capacitors C11-C14.

An RF signal, which is a voltage signal of a radio frequency band, is applied as input to voltage-current conversion unit 11. Voltage-current conversion unit 11 converts the RF signal that was received to a current signal and supplies the current signal from its own output terminal.

RF path selection unit 12 includes input terminal I to which is applied the RF signal that was supplied from voltage-current conversion unit 11 and a plurality of output terminals. In addition, a signal group that includes a plurality of signals that are multiplied by the RF signal received at input terminal I is applied as input to RF path selection unit 12.

In the present exemplary embodiment, it is assumed that RF path selection unit 12 has four output terminals. The output terminals of RF path selection unit 12 are hereinbelow referred to as output terminals T1-T4. In addition, the signal group is assumed to be a four-phase clock signal having clock signals CLKI, CLKQ, CLKIB, and CLKQB, which are four binary signals for which the plurality of signals do not become high level at the same time. Accordingly, the four-phase clock signals have four states.

FIG. 6A is a timing chart showing the four-phase clock signal. As shown in FIG. 6A, clock signals CLKI, CLKQ, CLKIB, and CLKQB in the four-phase clock signal have a duty ratio of 25%, and the phases of each differ by 90 degrees.

The four-phase clock signal is generated from an LO signal that is the oscillation signal of a local oscillator of the reception circuit that includes the present orthogonal mixer circuit. If it is assumed that the period of the LO signal (LO period) is equal to the period of each clock signal, the duty ratio in each clock signal is 25% and the period of high level is one-quarter that of the LO period.

Returning to the explanation of FIG. 5, RF path selection unit 12 switches the connection relationship of input terminal I and output terminals T1-T4 in accordance with the states of the four-phase clock signal and supplies, separately from output terminals T1-T4, a plurality of signals obtained by multiplying each clock signal among the four-phase clock signals by the RF signal that was applied as input to input terminal I. More specifically, RF path selection unit 12 connects input terminal I to any of output terminals T1-T4 in accordance with the state of the four-phase clock signal.

The plurality of signals obtained by multiplying each clock signal by the RF signal are IQ signals that include I signals and Q signals. Each of the I signals and Q signals are differential signals. In addition, a positive-phase signal of an I signal is supplied from output terminal T1, a negative-phase signal of an I signal is supplied from output terminal T2, a positive-phase Q signal is supplied from output terminal T3, and a negative-phase Q signal is supplied from output terminal T4.

IF path selection unit 13 includes a plurality of input terminals to which each of the IQ signals that were supplied from output terminals T1-T4 of RF path selection unit 12 are applied as input and a plurality of output terminals.

The IQ signals that are applied as input to these input terminals are integrated at load capacitors C11-C14 (to be explained) and converted to signals of the intermediated frequency (IF) band. The IQ signals that have been converted to signals of the intermediate frequency band are hereinbelow referred to as IF signals. In addition, the I signals that have been converted to signals of the intermediate frequency band are referred to as IF signals IF_I and the Q signals that have been converted to the intermediate frequency band are referred to as IF signals IF_Q.

In the present exemplary embodiment, it is assumed that IF path selection unit 13 has four input terminals and four output terminals. The input terminals of IF path selection unit 13 are referred to as input terminals IF_I+, IF_I−, IF_Q+, and IF_Q−, respectively, and the output terminals of IF path selection unit 13 are referred to as output terminals P1-P4.

Input terminal IF_I+ is connected to output terminal T1 of RF path selection unit 12, input terminal IF_I− is connected to output terminal T2 of RF path selection unit 12, input terminal IF_Q+ is connected to output terminal T3 of RF path selection unit 12, and input terminal IF_Q− is connected to output terminal T4 of RF path selection unit 12.

In addition, selection signal S that switches the connection relationship of the input terminals and output terminals is applied as input to IF path selection unit 13. The number of states of the selection signal is assumed to be equal to the number of output terminals of IF path selection unit 13. Accordingly, since there are four output terminals of IF path selection unit 13, there are also four states of the selection signal.

The states of the selection signal preferably transition in a predetermined order. The states of the selection signal preferably transition in fixed time intervals. Still further, the frequency of selection signal S is preferably no greater than the frequency of the IF signal that is applied as input to the input terminal of IF path selection unit 13 and is more preferably equal to the frequency of the IF signal.

In the following explanation, select on signal S, similar to the four-phase clock signal, is assumed to have individual selection signals S1-S4, which are four binary signals that do not become high level at the same time. The selection signals S are hereinbelow referred to as selection signal S=(S1, S2, S3, S4).

FIG. 6B is a timing chart showing selection signal S. As shown in FIG. 6B, the individual selection signals S1-S4 in selection signal S have a duty ratio of 25% and phases that each differ by 90 degrees, similar to the clock signal shown in FIG. 6A. The frequency of the individual selection signals differs from the frequency of the clock signal.

Returning to the explanation of FIG. 5, IF path selection unit 13 switches the connection relationship of its own input terminals and output terminals in accordance with the state of selection signal S and supplies the IF signal that was applied as input to each input terminal from the output terminal that is connected to that input terminal. More specifically, IF path selection unit 13 connects each of its own input terminals to any its own output terminals without duplication in accordance with the state of the selection signal.

Load resistors R11-R14 are loads that are connected to the output terminals of IF path selection unit 13 and are loads for converting IQ signals to voltage signals.

In the present exemplary embodiment, one end of each of load resistors R11-R14 is connected to any of the output terminals P1-P4 of IF path selection unit 13 without duplication. In FIG. 5, load resistor R11 is connected to output terminal P1, load resistor R12 is connected to output terminal P2, load resistor R13 is connected to output terminal P3, and load resistor R14 is connected to output terminal P4. In addition, the other end of each of load resistors R11-R14 is connected to the power-supply terminal.

Load capacitors C11-C14 are loads that are connected to the output terminals of RF path selection unit 12 and are loads for smoothing the IF signal.

One end of each of load capacitors C11-C14 is connected to any of the output terminals of RF path selection unit 12 without duplication. In FIG. 5, load capacitor C11 is connected to input terminal IF_I+, load capacitor C12 is connected to input terminal IF_I−, load capacitor C13 is connected to input terminal IF_Q+, and load capacitor C14 is connected to input terminal IF_Q−. In addition, the other end of each of load capacitors C11-C14 is connected to the power-supply terminal.

In addition, load capacitors C11-C14 are connected in parallel to load resistors R11-R14 by way of IF path selection unit 13. As a result, load capacitors C11-C14 and load resistors R11-R14 form a low-pass filter (LPF).

RF path selection unit 12 corresponds to the first path selector and IF path selection unit 13 corresponds to the second path selector. Load capacitors C11-C14 constitute the first load unit, and load resistors R11-R14 constitute the second load unit. Each of load resistors R11-R14 is connected to any of output terminals P1-P4 of IF path selection unit 13 without duplication, and the second load unit therefore has a plurality of loads that are connected to each of output terminals P1-P4.

In addition, input terminal I corresponds to the first input terminal, input terminals IF_I+, IF_I−, IF_Q+, and IF_Q− correspond to the second input terminals, output terminals T1-T4 correspond to the first output terminals, and output terminals P1-P4 correspond to the second output terminals. The RF signal that is applied as input to voltage-current conversion unit 11 corresponds to the first signal, clock signals CLKI, CLKQ, CLKIB, and CLKQB correspond to the second signals, the four-phase clock signal corresponds to the signal group, the IQ signals correspond to the third signals, and the selection signal S corresponds to the fourth signal.

The operations of the orthogonal mixer circuit of the present exemplary embodiment are next described. The four-phase clock signals are assumed to be the signals shown in FIG. 6A, and selection signals S are assumed to be the signals shown in FIG. 6B.

The RF signal is first applied as input to voltage-current conversion unit 11. Voltage-current conversion unit 11 converts the RF signal to a current signal and applies the current signal to input terminal I of RF path selection unit 12.

RF path selection unit 12 connects input terminal I to any of output terminals T1-T4 of RF path selection unit 12 in accordance with the state of the four-phase clock signal and thus time-divides the IQ signals and supplies the result to load capacitors C11-C14.

More specifically, when clock signal CLKI is high level, RF path selection unit 12 connects input terminal I to output terminal T1 and supplies the IQ signal to load capacitor C11. When clock signal CLKQ is high level, RF path selection unit 12 connects input terminal I to output terminal T2 and supplies the IQ signal to load capacitor C13. When clock signal CLKIB is high level. RF path selection unit 12 connects input terminal I to output terminal T3 and supplies the IQ signal to load capacitor C12. Finally, when clock signal CLKQB is high level, RF path selection unit 12 connects input terminal I to output terminal T4 and supplies the IQ signal to load capacitor C14. In this way, the IQ signals are integrated in load capacitors C11-C14 and applied as input to IF path selection unit 13 as an IF signal in which the RF signal has undergone frequency-conversion.

The IF signal is converted to a voltage signal by load resistors R11-R14 that are connected to load capacitors C11-C14 in IF path selection unit 13 and then supplied from between load capacitors C11-C14 and IF path selection unit 13 to a circuit of a succeeding stage such as an amplifier (not shown).

In addition, IF path selection unit 13 switches the connection relationship of its own input terminals and output terminals and switches the connection relationship of load capacitors C11-C14 and load resistors R11-R14 in accordance with the state of selection signal S.

FIGS. 7A, 7B, 7C, and 7D are views for explaining the operations of IF path selection unit 13 in greater detail.

Figure 7A:
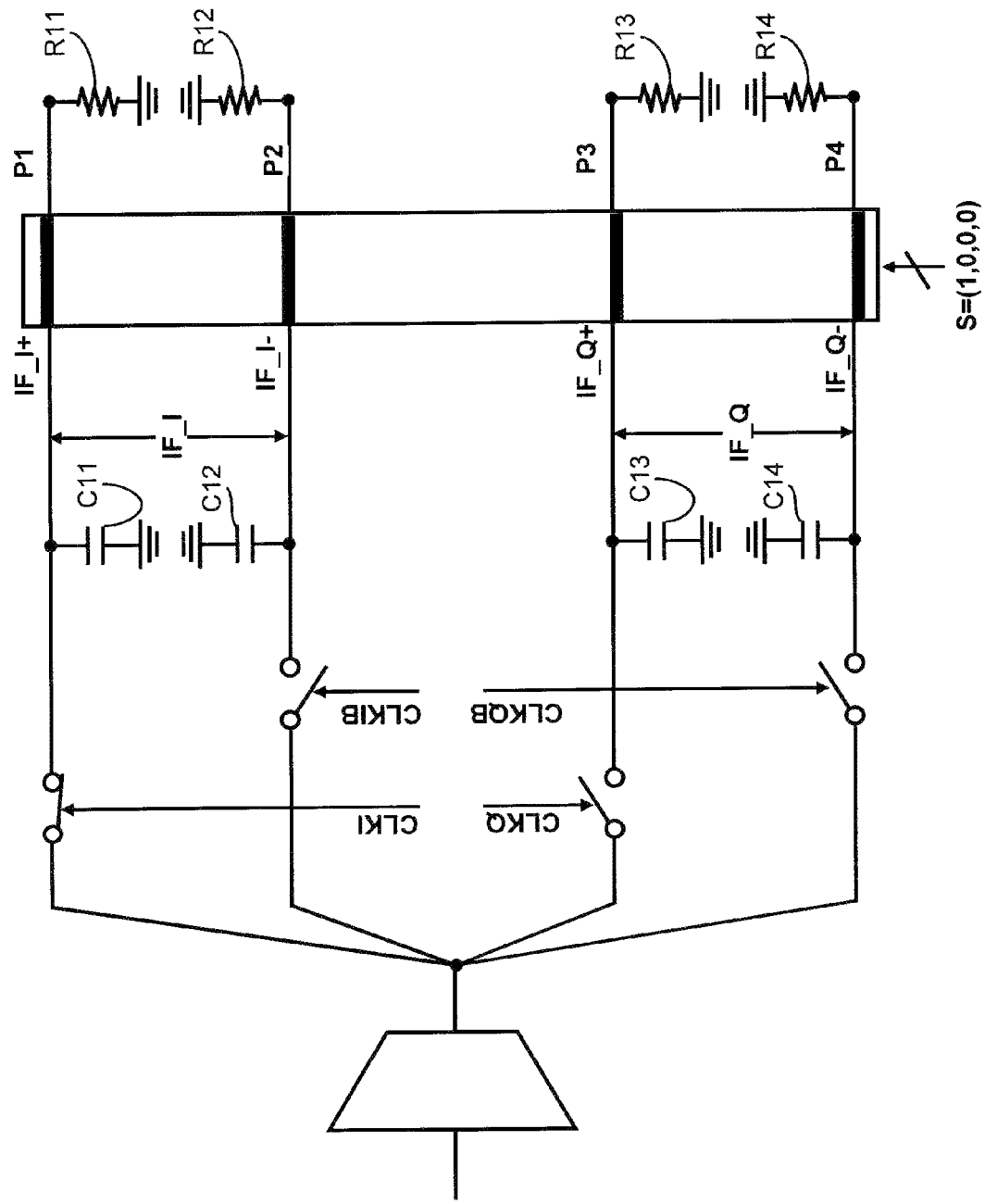
FIG. 7A is a view for describing an example of the operation of an IF path selection unit.

As shown in FIG. 7A, during the interval in which individual selection signal S1 is high level, IF path selection unit 13 connects load capacitor C11 to load resistor R11, connects load capacitor C12 to load resistor R12, connects load capacitor C13 to load resistor R13, and connects load capacitor C14 to load resistor R14.

As shown in FIG. 7B, during the interval in which individual selection signal S2 is high level, IF path selection unit 13 connects load capacitor C11 to load resistor R14, connects load capacitor C12 to load resistor R13, connects load capacitor C13 to load resistor R11, and connects load capacitor C14 to load resistor R12.

Figure 7C:
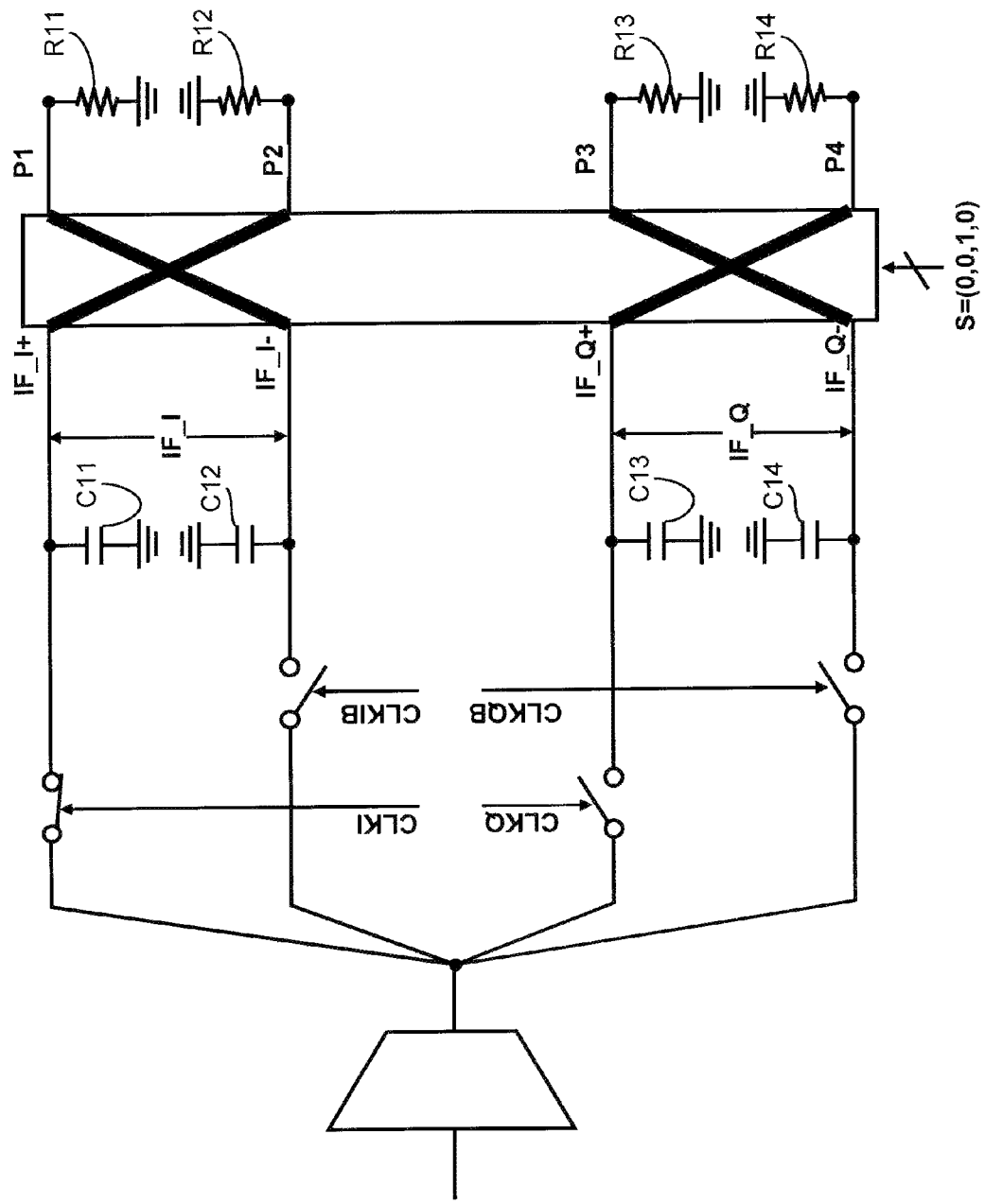
FIG. 7C is a view for describing an example of the operation of an IF path selection unit.

As shown in FIG. 7C, during the interval in which individual selection signal S3 is high level, IF path selection unit 13 connects load capacitor C11 to load resistor R12, connects load capacitor C12 to load resistor R11, connects load capacitor C13 to load resistor R14, and connects load capacitor C14 to load resistor R13.

As shown in FIG. 7D, during the interval in which individual selection signal S4 is high level, IF path selection unit 13 connects load capacitor C11 to load resistor R13, connects load capacitor C12 to load resistor R14, connects load capacitor C13 to load resistor R12, and connects load capacitor C14 to load resistor R11.

Figure 8:
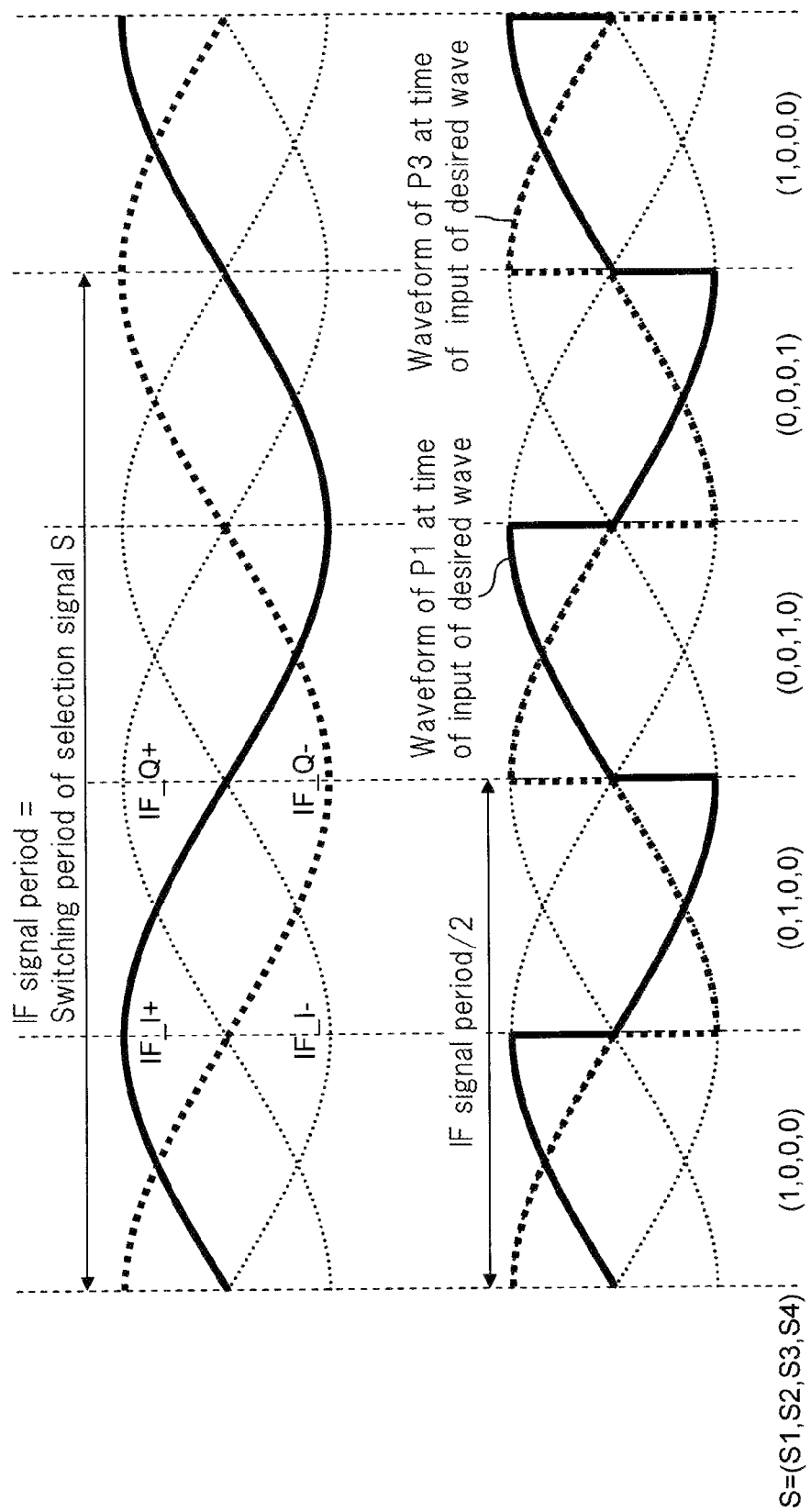
FIG. 8 shows examples of the signal waveforms of an IF signal.

FIG. 8 is a view showing the signal waveforms of the IF signal that is applied as input to the input terminals of IF path selection unit 13 and the signal waveforms of the IF signal that is supplied as output from the output terminals of IF path selection unit 13. In FIG. 8, the period of selection signal S is equal to the period of the IF signal.

The upper portion of FIG. 8 shows the signal waveform (thick solid line) at input terminal IF_I+ to which load capacitor C11 is connected and the signal waveform (thick dotted line) at input terminal IF_Q+ to which load capacitor C13 is connected. The lower portion of FIG. 8 shows the signal waveform (thick solid line) at output terminal P1 to which load resistor R11 is connected and the signal waveform (thick dotted line) at output terminal P3 to which load resistor R13 is connected.

As shown in FIG. 8, IF path selection unit 13 has the function of modulating (up-converting) the IF signal based on selection signal S, and an IF signal that has been converted to a frequency that is twice that of the selection signal S (i.e., twice that of the original IF signal) is supplied from output terminals P1-P4.

By repeating the above-described operations, each of load capacitors C11-C14 is time-divided and connected to all of load resistors R11-R14. In this way, amplitude errors and phase errors of the IF signal that are produced by variations of load resistors R11-R14 are averaged over time by load capacitors C11-C14 and an IF signal can be obtained that is free of amplitude errors and phase errors.

The specific configuration of voltage-current conversion unit 11 is next described.

Figure 9:
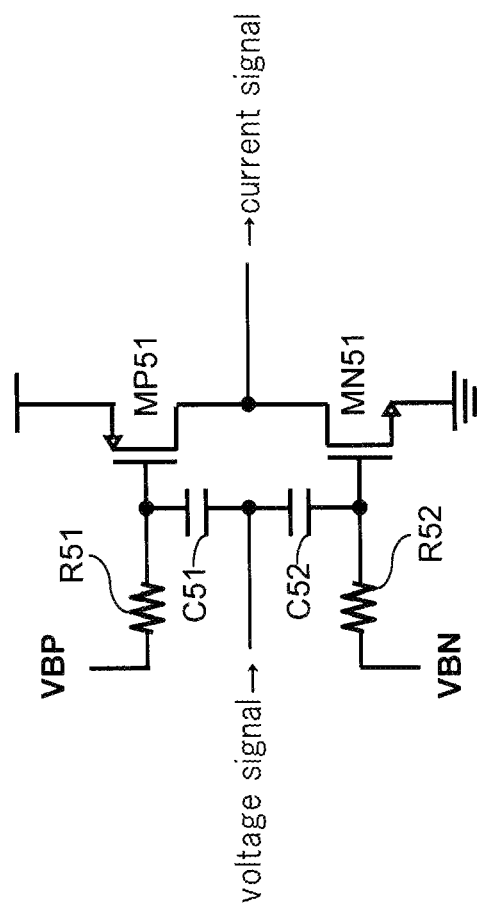
FIG. 9 is a circuit diagram showing an example of the configuration of a voltage-current conversion unit.

FIG. 9 is a circuit diagram showing an example of the configuration of voltage-current conversion unit 11. In FIG. 9, voltage-current conversion unit 11 includes capacitance elements C51 and C52, resistance elements R51 and R52, PMOS transistor MP51, and NMOS transistor MN51.

NMOS transistor MN51 and PMOS transistor MP51 make up a CMOS transistor and take on the mutually complementary roles of drive section and load section according to the value of the input voltage applied as input to its gate. In addition, bias voltage VBP is applied by way of resistance element R51 to the gate of PMOS transistor MP51 and bias voltage VBN is applied by way of resistance element R52 to the gate of NMOS transistor MN51.

The RF signal that is applied to voltage-current conversion unit 11 is split into two signals, one of the split RF signals being stripped of its direct-current component in capacitance element C51 and applied as input to the gate of PMOS transistor MP51, and the other RF signal being stripped of its direct-current component in capacitance element C52 and then applied as input to the gate of NMOS transistor MP52. A current of a value that is proportional to the value of the RF signal is thus supplied from the drains of NMOS transistor MN51 and PMOS transistor MP51. The RF signal is accordingly converted to a current signal and supplied as output.

A specific configuration of a circuit that generates a four-phase clock signal is next described.

A four-phase local signal having a duty ratio of 50% and that includes local signals LO_I, LO_Q, LO_IB, and LO_QB of phases that each differ by 90 degrees is generated from the LO signal of a local oscillator, and the four-phase clock signal is generated from this four-phase local signal.

Figure 10A:
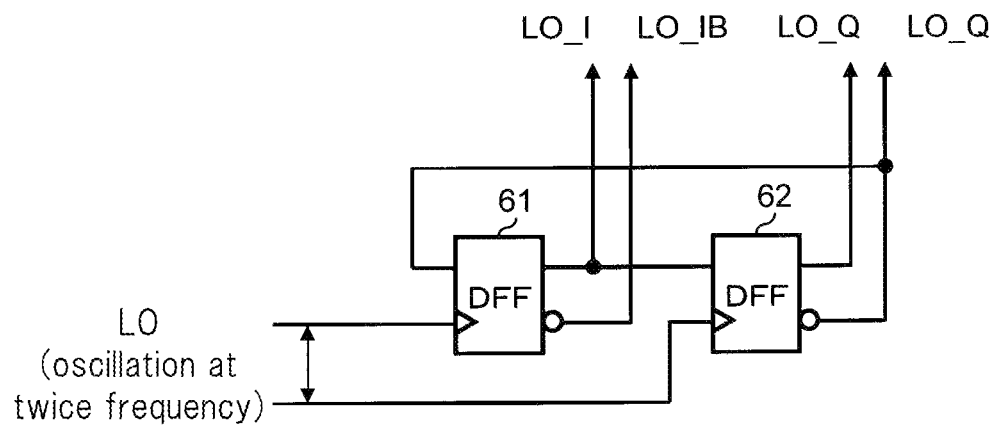
FIG. 10A is a circuit diagram showing an example of the configuration of the first generation circuit.
Figure 10B:
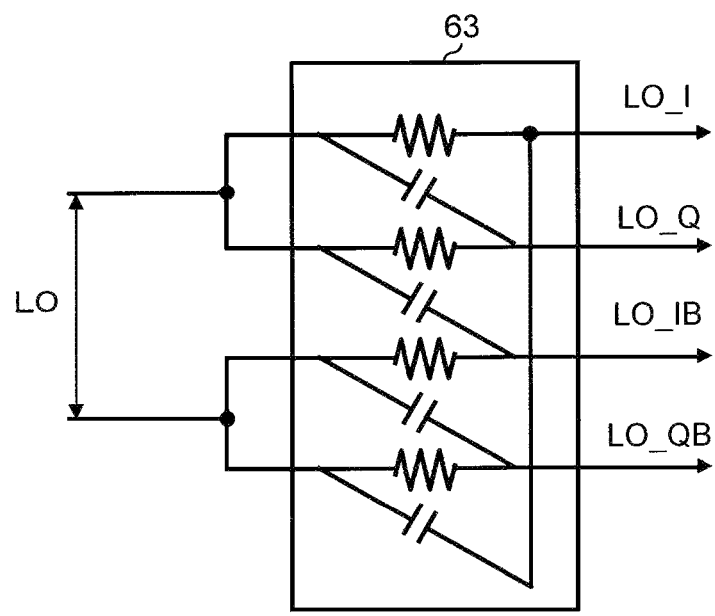
FIG. 10B is a circuit diagram showing another example of the configuration of the first generation circuit.

FIGS. 10A and 10B are circuit diagrams that show examples of the configuration of a first generation circuit that generates a four-phase local signal.

In FIG. 10A, the first generation circuit includes delay-type flip-flops (DFF) 61 and 62.

An LO signal that is oscillated at twice the frequency of the four-phase local signal is applied as input to each of delay-type flip-flops 61 and 62. Each of delay-type flip-flops 61 and 62 frequency-divides the LO signal by half and supplies the result as local signals LO_I, LO_Q, LO_IB, and LO_QB.

In FIG. 10B, the first generation circuit uses polyphase filter 63 to rotate by 90 degrees the phases of LO signals of the same frequency as the four-phase local signal and supply the result as local signals LO_I, LO_Q, LO_IB, and LO_QB.

Figure 10C:
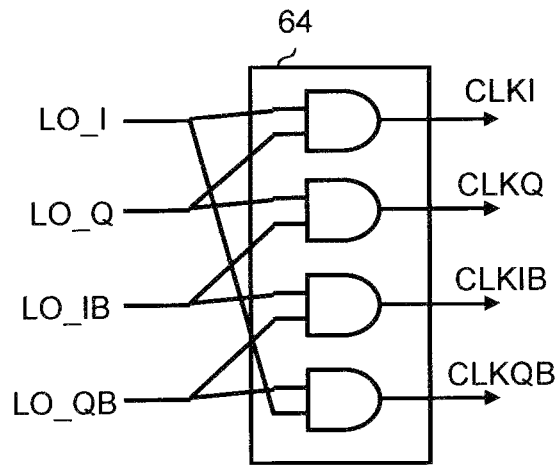
FIG. 10C is a circuit diagram showing an example of the configuration of the second generation circuit.

FIG. 10C is a circuit diagram showing an example of the configuration of a second generation circuit that generates a four-phase clock signal from a four-phase local signal.

In FIG. 10C, the second generation circuit has AND unit 64 composed of four AND circuits. AND unit 64 generates clock signals CLKI, CLKQ, CLKIB, and CLKQB by calculating the AND for each combination of two signals selected from local signals LO_I, LO_Q, LO_IB, and LO_QB.

More specifically, AND unit 64 calculates the AND of local signals LO_QB and LO_I to generate clock signal CLKI, calculates the AND of local signals LO_I and LO_Q to generate clock signal CLKQ, calculates the AND of local signals LO_Q and LO_IB to generate clock signal CLKIB, and calculates the AND of local signals LO_IB and LO_QB to generate clock signal CLKQB.

A specific configuration of a third generation circuit that generates selection signal S is next described.

Each individual selection signal in selection signal S has a different frequency than that of each clock signal in the four-phase clock signal but otherwise has basically matching characteristics. Selection signal S can therefore be generated using a circuit similar to the first generation circuit and second generation circuit described in FIGS. 10A to 10C. In addition, when generating selection signal S, the frequency of the LO signal is determined according to the frequency of selection signal S.

Figure 10D:
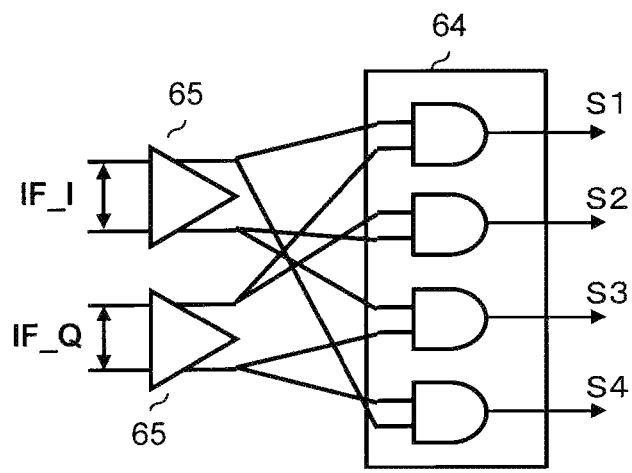
FIG. 10D is a circuit diagram showing an example of the configuration of the third generation circuit.

In addition, in the third generation circuit, the circuit shown in FIG. 10D may be used in place of the circuit shown in FIG. 10C.

In FIG. 10D, a selection signal of frequency and phase that depend on IF signals IF_I and IF_Q is generated by using IF signals IF_I and IF_Q that immediately follow orthogonal demodulation in place of an oscillating signal. In the third generation circuit shown in FIG. 10D, amplifiers 65 and 66 that amplify IF signals IF_I and IF_Q, respectively, are provided in the stage preceding AND unit 64. In addition, a two-bit counter circuit may be used in place of AND unit 64.

The first to third generation circuits described hereinabove have been described as separate from the orthogonal mixer circuit but may also be incorporated in the orthogonal mixer circuit.

A specific configuration of IF path selection unit 13 is next described.

Figure 11A:
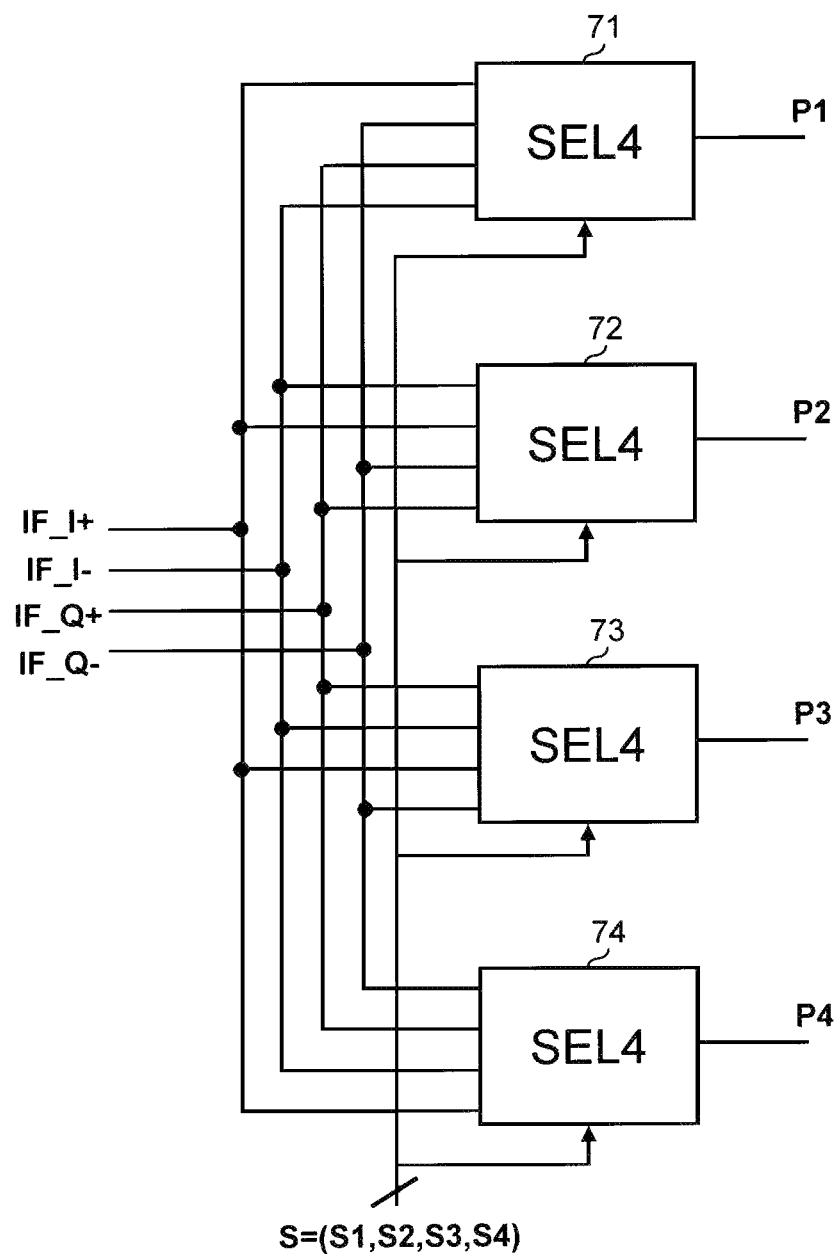
FIG. 11A is a circuit diagram showing an example of the configuration of an IF path selection unit.

FIG. 11A is a circuit diagram showing an example of the configuration of IF path selection unit 13. In FIG. 11A, IF path selection unit 13 includes selection circuits (SEL4 in FIG. 11A) 71-74 that are multiplexer circuits.

The input terminals of each of selection circuits 71-74 is connected to all of the input terminals of IF path selection unit 13, and the output terminal of selection circuits 71-74 is connected to any one of the output terminals of IF path selection unit 13 without duplication. In addition, selection signal S is applied as input to each of selection circuits 71-74.

Each of selection circuits 71-74 connects any of the input terminals of IF path selection unit 13 to the output terminal of IF path selection unit 13 that is connected to its own circuit in accordance with the state of selection signal S. Here, in the same state of selection signal S, selection circuits 71-74 separately connect input terminals to output terminals.

The connection relationship of input terminals and output terminals is hereinbelow represented as (A1, A2, A3, A4)= (B1, B2, B3, B4). This indicates that input terminal A1 and output terminal B1 are connected, input terminal A2 and output terminal B2 are connected, input terminal A3 and output terminal B3 are connected, and input terminal A4 and output terminal B4 are connected.

According to this representation, when individual selection signal S1 is high level, the result is (IF_I+, IF_I−, IF_Q+, IF_Q−)=(P1, P2, P3, P4), when individual selection signal S2 is high level, the result is (IF_I+, IF_I−, IF_Q+, IF_Q−)=(P2, P3, P4, P1), when individual selection signal S3 is high level, the result is (IF_I+, IF_I−, IF_Q+, IF_Q−) (P3, P4, P1, P2), and when individual selection signal S4 is high level, the result is (IF_I+, IF_I−, IF_Q+, IF_Q−)=(P4, P1, P2, P3).

Figure 11B:
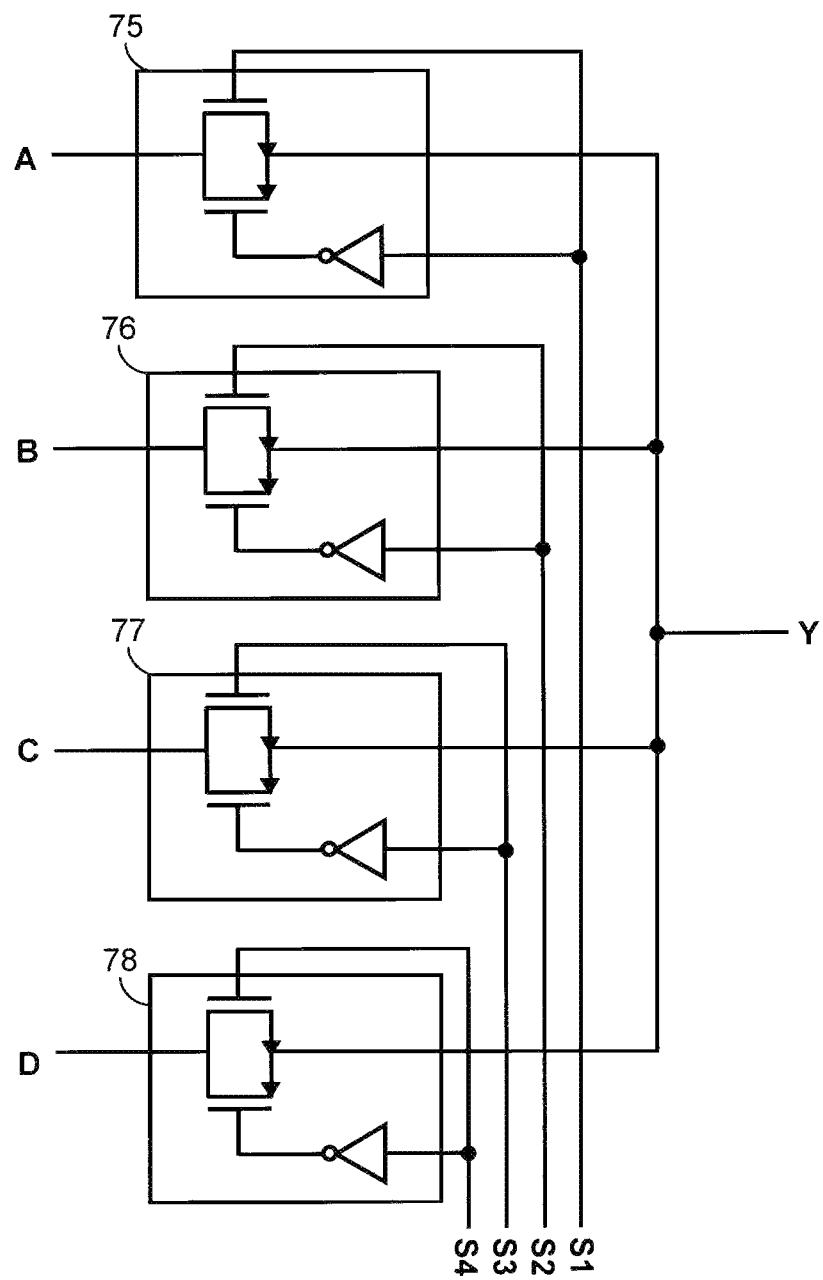
FIG. 11B is a circuit diagram showing an example of the configuration of a selection circuit.

FIG. 11B is a circuit diagram showing an actual configuration of a selection circuit. In FIG. 11B, the selection circuit includes switching elements 75-78. Each of switching elements 75-78 is configured using a transmission gate in which an NMOS transistor and PMOS transistor are combined.

Input terminals A-D of switching elements 75-78 are connected to any of the input terminals of IF path selection unit 13 without duplication. The input terminals Y of switching elements 75-78 are connected in common to the output terminal of the selection circuit. In addition, any one of individual selection signals S1-S4 is applied as input to the control terminals (the gates of the NMOS transistor and PMOS transistor) of switching elements 75-78 without duplication.

Switching elements 75-78 enter the open state when the individual selection signal S that was received as input is high level and connect the input terminal of IF path selection unit 13 that is connected to its own element to the output terminal of the selection circuit.

The selection circuit may be configured using switching elements made up from NMOS transistors or PMOS transistors. In addition, similar to IF path selection unit 13, RF path selection unit 12 can be configured using switching elements that include NMOS transistors, PMOS transistors, or both.

According to the present exemplary embodiment, voltage-current conversion unit 11 converts an RF signal that is a voltage signal to a current signal and supplies the result as output. RF path selection unit 12 connects its own input terminal to any of its own output terminals according to the state of a four-phase clock signal and separately supplies a plurality of IF signals obtained by multiplying each of clock signals in a four-phase clock signal by the RF signal from its own output terminals. IF path selection unit 13 switches the connection relationship of its own input terminals and output terminals in accordance with selection signal S and supplies the IF signal that was received as input at each of its own input terminals from its own output terminal that was connected to the input terminal. Load capacitors C11-C14 are connected to the output terminals of RF path selection unit 12 and smooth the IF signal. Load resistors R11-R14 are connected to the output terminals of the IF path selection unit and convert the IF signal to a voltage signal.

In this case, the connection relationship with output terminals P1-P4 to which are connected load resistors R11-R14 that convert the IF signal to a voltage signal is switched according to the selection signal. As a result, the IF signal can be time-divided and applied to each of load resistors R11-R14, whereby the phase errors and amplitude errors of the IF signal that are caused by the variation of load resistors R11-R14 can be averaged. Accordingly, the phase errors and amplitude errors of the IF signal can be compensated. In addition, because there is no need for the detection of the phase errors and amplitude errors or for the adjustment of the values of load resistors R11-R14, there is no need to provide a compensation system or variability function of load resistors R11-R14. As a result, amplitude errors and phase errors can be compensated while reducing the circuit complexity.

In addition, the only circuit that is newly added to the orthogonal mixer circuit of the prior art is IF path selection unit 13, and IF path selection unit 13 can be configured using digital circuits such as simple counter circuits or selection circuits. Still further, these digital circuits can be configured using, for example, minute CMOS transistors, whereby the newly added circuits can be configured in an extremely small area. Accordingly, the increase in area for compensating phase errors and amplitude errors can be made extremely small.

The current consumption of the newly added circuits is no more than the feed-through current that flows in the instant of switching of the states of selection signal S or the four-phase clock signal. In addition, the newly added circuits can use minute CMOS transistors and can therefore reduce the feed-through current to an extremely low level. Accordingly, the power consumption for compensating phase errors and amplitude errors can be reduced to an extremely low level.

In the present exemplary embodiment, the number of output terminals of RF path selection unit 12 and the number of states of the four-phase clock signal are four each. In this case, the present mixer circuit can be used as an orthogonal circuit that generates I signals and Q signals, which are differential signals.

In the present exemplary embodiment, the four-phase clock signals have a duty ratio of 25% and are binary signals or inverted signals of the binary signals in which the phase of each signal differs by 90 degrees.

In this case, I signals and Q signals can be generated accurately while sharing voltage-current conversion unit 11 for use by I signals and the voltage-current conversion unit for use by Q signals.

In the present exemplary embodiment, the number of selection signal states is equal to the number of output terminals of IF path selection unit 13. The second load unit includes a plurality of load resistors R11-R14 that are connected to each of the output terminals of IF path selection unit 13. In addition, IF path selection unit 13 connects each of the input terminals of IF path selection unit 13 to output terminals of IF path selection unit 13 without duplication in accordance with the state of the selection signal.

In this case, the output terminals of RF path selection unit 12 can be time-divided and connected to all load resistors R11-R14, whereby phase errors and amplitude errors arising from variations among load resistors R11-R14 can be accurately compensated.

In the present exemplary embodiment, the states of the selection signal transition in a predetermined order. In this case, a periodic signal can be used as the selection signal, and the influence of the variations of load resistors R11-R14 can be easily compensated.

In the present exemplary embodiment, moreover, the state of the selection signal transitions at fixed time intervals. In this case, the output terminals of RF path selection unit 12 can be connected to each of all load resistors R11-R14 for equal time intervals, and phase errors and amplitude errors that arise from variations in load resistors R11-R14 can be more accurately compensated.

In addition, in the present exemplary embodiment, the first load unit includes load capacitors C11-C14. In this case, load capacitors C11-C14 and load resistors R11-R14 form LPFs and the IF signal can be constantly connected to these LPFs. As a result, the signal waveform of the IF signal can be continued as shown in FIG. 3, rendering a prefilter unnecessary.

In the present exemplary embodiment, the frequency of selection signal S is no greater than the frequency of the IF signal that is applied as input to IF path selection unit 13. In this case, an IF signal can be applied to all of load resistors R11-R14 in one period of the IF signal, whereby phase errors and amplitude errors that arise from variations in load resistors R11-R14 can be more accurately compensated.

In the present exemplary embodiment, the influence of variations in load capacitors C11-C14 cannot be compensated. However, variations in capacitance elements are typically extremely small compared to the variations of resistance elements such as transistors, and the influence of variations of load capacitors C11-C14 can therefore be ignored.

In the present exemplary embodiment, four load resistors were used but five or more load resistors may also be prepared. In this case, four load resistors among the prepared load resistors are selected and used by a random or predetermined rule. At this time, the number of output terminals of IF path selection unit 13 or states of selection signal S must be increased according to the number of load resistors.

In addition, by applying a first intermediate frequency signal as input in place of the RF signal, the present mixer circuit can be used for the purpose of supplying a baseband signal or second intermediate frequency band signal, and by applying a baseband signal or intermediate frequency signal as input, the mixer circuit can be used for the purpose of supplying an RF signal.

In the present exemplary embodiment, moreover, a clock signal having a duty ratio of 25% was used to convert the frequency of an RF signal, but the effect of averaging variations of the load resistors over time can also be obtained when using a clock signal having a duty ratio of 50% such as local signals LO_I, LO_Q, LO_IB, and LO_QB.

In addition, the phase relations of local signals LO_I, LO_Q, LO_IB, and LO_QB or clock signals CLKI, CLKQ, CLKIB, and CLKQB may be inverted as appropriate according to the frequency of the IF signal or the frequency of the oscillating signal LO.

The period of selection signal S need not be fixed and may change together with the passage of time. The intervals in which individual selection signals S1, S2, S3 and S4 are high level need not all be equal, and may be set to any time ratio or may change with time. In such cases, the higher harmonics of selection signal S are spread over a broad band and the concentration of power of unneeded waves at specific frequency can be prevented.

Still further, the connection relationship of load capacitors C11-C14 and load resistors R11-R14 according to the states of selection signal S is not limited to the connection relationship described in FIGS. 7A-7D and can be altered as appropriate. Further, the connection relationship may be switched in any order.

The second exemplary embodiment is next described.

Figure 12:
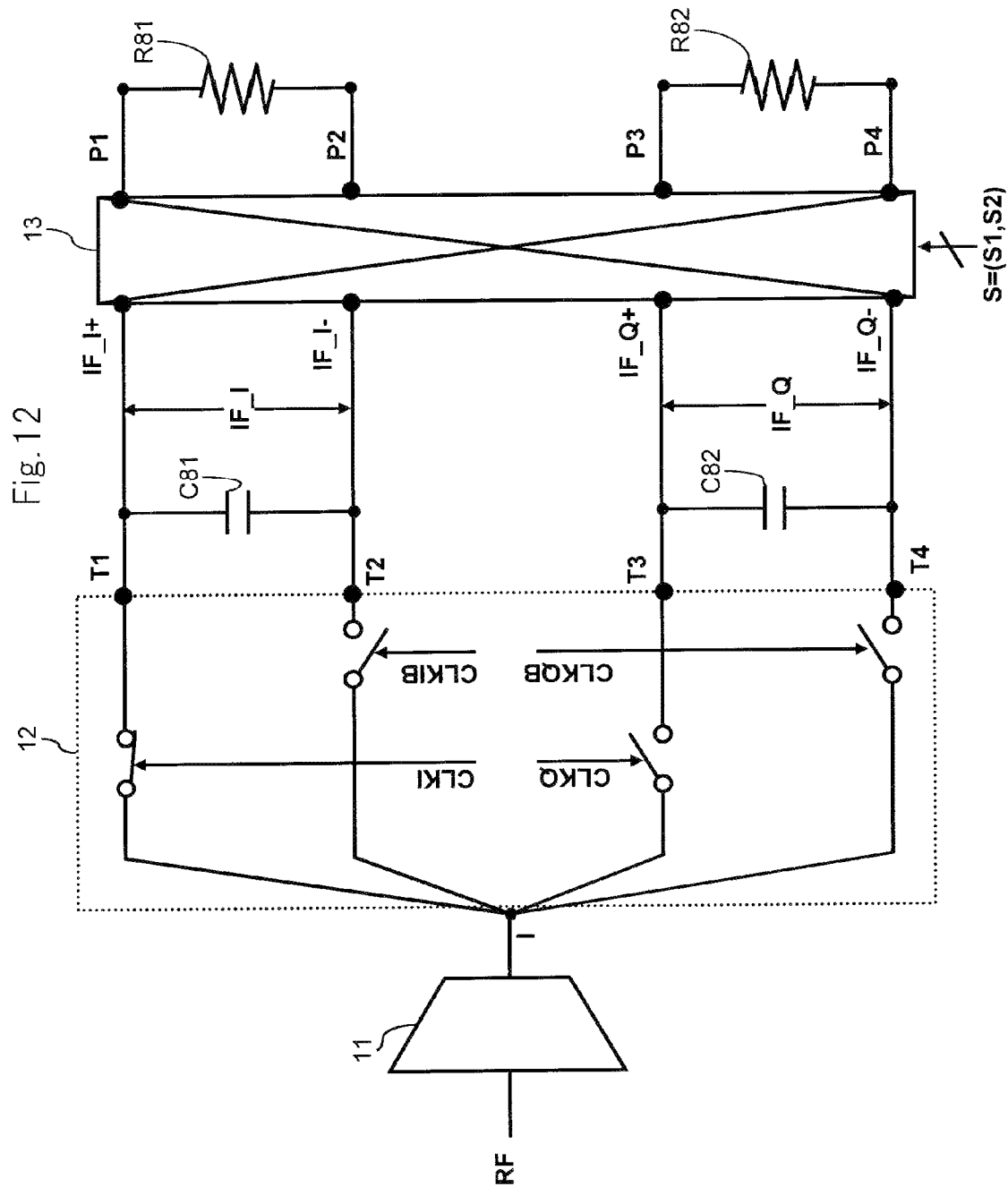
FIG. 12 is a circuit diagram showing the configuration of the orthogonal mixer circuit of the second exemplary embodiment.

FIG. 12 is a circuit diagram showing the first orthogonal mixer circuit of the present exemplary embodiment. Compared to FIG. 6, the orthogonal mixer circuit in FIG. 12 includes load resistors R81 and R82 in place of load resistors R11-R14 and load capacitors C81 and C82 in place of load capacitors C11-C14.

Load capacitors C81 and C82 are connected to the output terminals of RF path selection unit 12. More specifically, load capacitor C81 is provided between the signal lines of each of the positive-phase signal and negative-phase signal of IF signal IF_I, and load capacitor C82 is provided between the signal lines of each of the positive-phase signal and negative-phase signal of IF signal IF_Q.

Load resistors R81 and R82 are connected to the output terminals of IF path selection unit 13. More specifically, load resistor R81 is connected between output terminals P1 and P2, and load resistor R82 is connected between output terminals P3 and P4.

In FIG. 12, there are only two load resistors in which variations occur. As a result, the influence of the variation of the load resistors can be suppressed if IF path selection unit 13 connects input terminal IF_I+ and IF_Q+ to either of output terminals P1 and P3 without duplication and connects input terminals IF_I− and IF_Q− to either of output terminals P2 and P4 without duplication according to selection signal S.

As a result, selection signal S need only have two states. In other words, the individual selection signals included in selection signal S may be the two individual selection signals S1 and S2. If a configuration is adopted in which the input terminals and output terminals of IF path selection unit 13 are always connected, a binary signal having a duty ratio of 50% and the inverted signal of this binary signal can be used as individual selection signals S1 and S2.

Figure 13A:
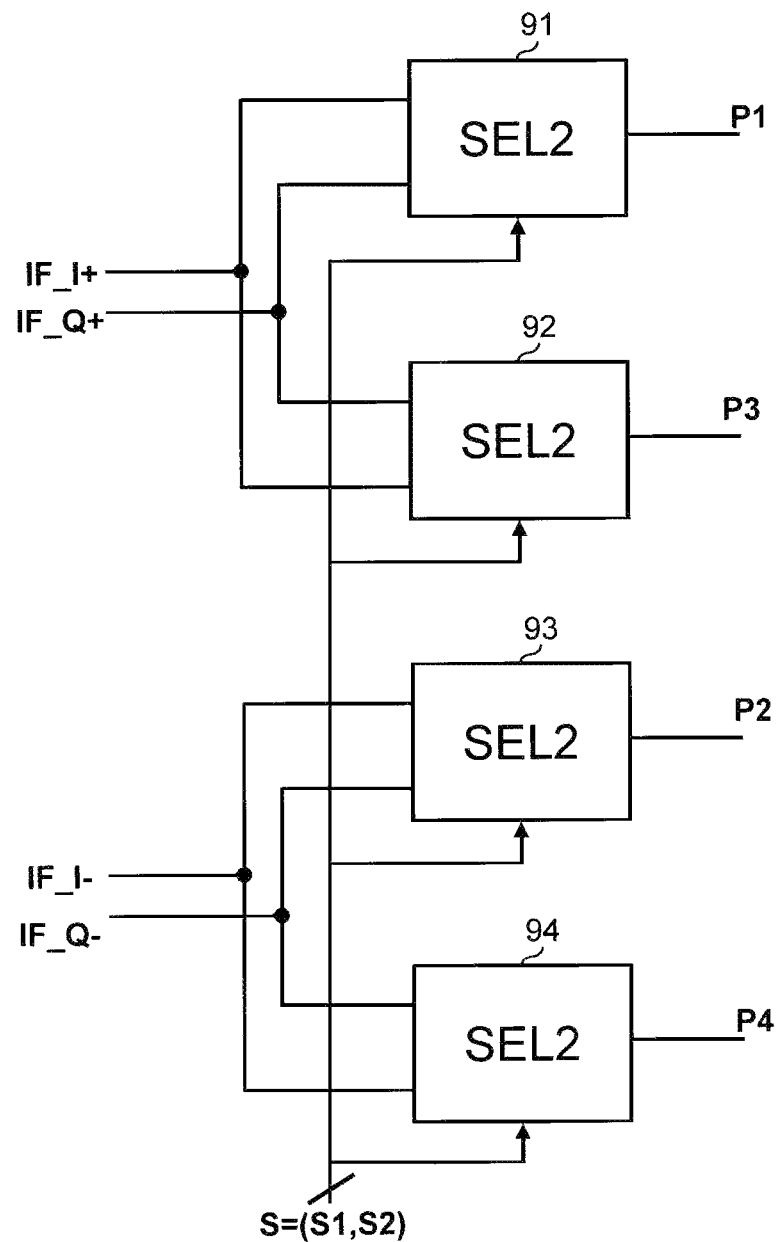
FIG. 13A is a circuit diagram showing another example of the configuration of the IF path selection unit.

FIG. 13A is a circuit diagram showing a concrete example of the configuration of IF path selection unit 13 in the present exemplary embodiment. In FIG. 13A, IF path selection unit 13 includes selection circuits (SEL2 in FIG. 13A) 91-94 that are multiplexer circuits.

Terminals IF_I+ and IF_Q+ of IF path selection unit 13 are connected to the input terminals of selection circuits 91 and 92, and input terminals IF_I− and IF_Q− of RF path selection unit 12 are connected to the input terminals of selection circuits 93 and 94. In addition, output terminal P1 of IF path selection unit 13 is connected to the output terminal of selection circuit 91, output terminal P3 of IF path selection unit 13 is connected to the output terminal of selection circuit 92, output terminal P2 of IF path selection unit 13 is connected to the output terminal of selection circuit 93, and output terminal P4 of IF path selection unit 13 is connected to the output terminal of selection circuit 94. Selection signal S is then applied as input to each of selection circuits 91-94.

In accordance with the state of selection signal S, each of selection circuits 91-94 connects any of the input terminals of IF path selection unit 13 that is connected to its own circuit to the output terminal of IF path selection unit 13 that is connected to its own circuit. Here, selection circuits 91-94 connect individual input terminals to output terminals in the same state of selection circuit S.

For example, when individual selection signal S1 is high level, selection circuit 91 connects input terminal IF_I+ to output terminal P1, selection circuit 92 connects input terminal IF_Q+ to output terminal P3, selection circuit 93 connects input terminal IF_I− to output terminal P2, and selection circuit 94 connects input terminal IF_Q− to output terminal P4.

On the other hand, when individual selection signal S2 is high level, selection circuit 91 connects input terminal IF_Q+ to output terminal P1, selection circuit 92 connects input terminal IF_I+ to output terminal P3, selection circuit 93 connects input terminal IF_Q− to output terminal P2, and selection circuit 94 connects input terminal IF_I− to output terminal P4.

Figure 13B:
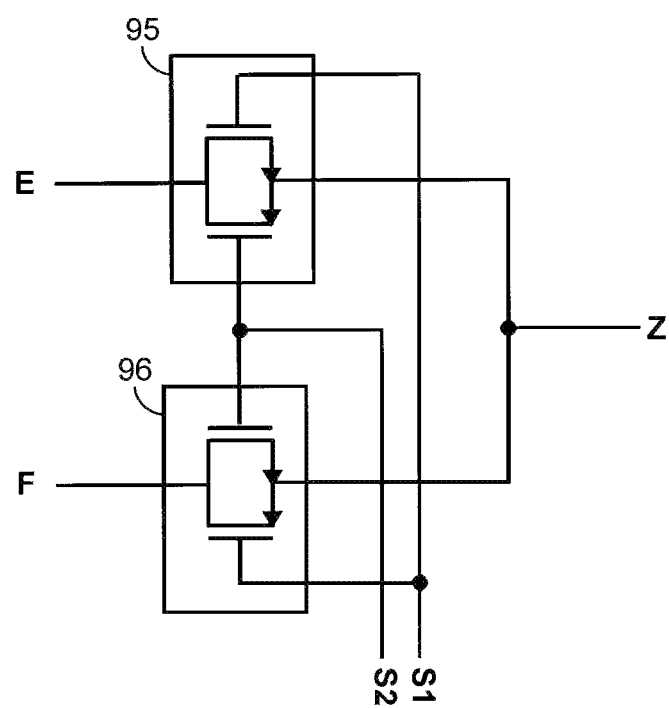
FIG. 13B is a circuit diagram showing another example of a selector circuit.

FIG. 13B is a circuit diagram showing the actual configuration of the selection circuit of IF path selection unit 13 shown in FIG. 13A. In FIG. 13B, the selection circuit includes switching elements 95 and 96. Each of switching elements 95 and 96 is configured using transmission gates in which NMOS transistors and PMOS transistors are combined.

Input terminals E and F of switching elements 95 and 96 are connected to either of the input terminals of the selection circuit without duplication. Output terminals Z of switching elements 95 and 96 are shared and connected to the output terminal of the selection circuit. In addition, either of individual selection signals S1 and S2 is applied as input to the control terminals of switching elements 95 and 96. Switching elements 95 and 96 enter the open state when the individual selection signal that is received as input is high level.

Providing the above-described construction enables a reduction of the number of load resistors and load capacitors, whereby the area and cost of the orthogonal mixer circuit can be kept low.

As in FIG. 5, load capacitance may be connected between signal lines and ground points. In this case, four load capacitors are necessary. In addition, the capacitance elements that are connected between signal lines and ground points and the capacitance elements that are connected between signal lines may be used as load capacitors.

Figure 14:
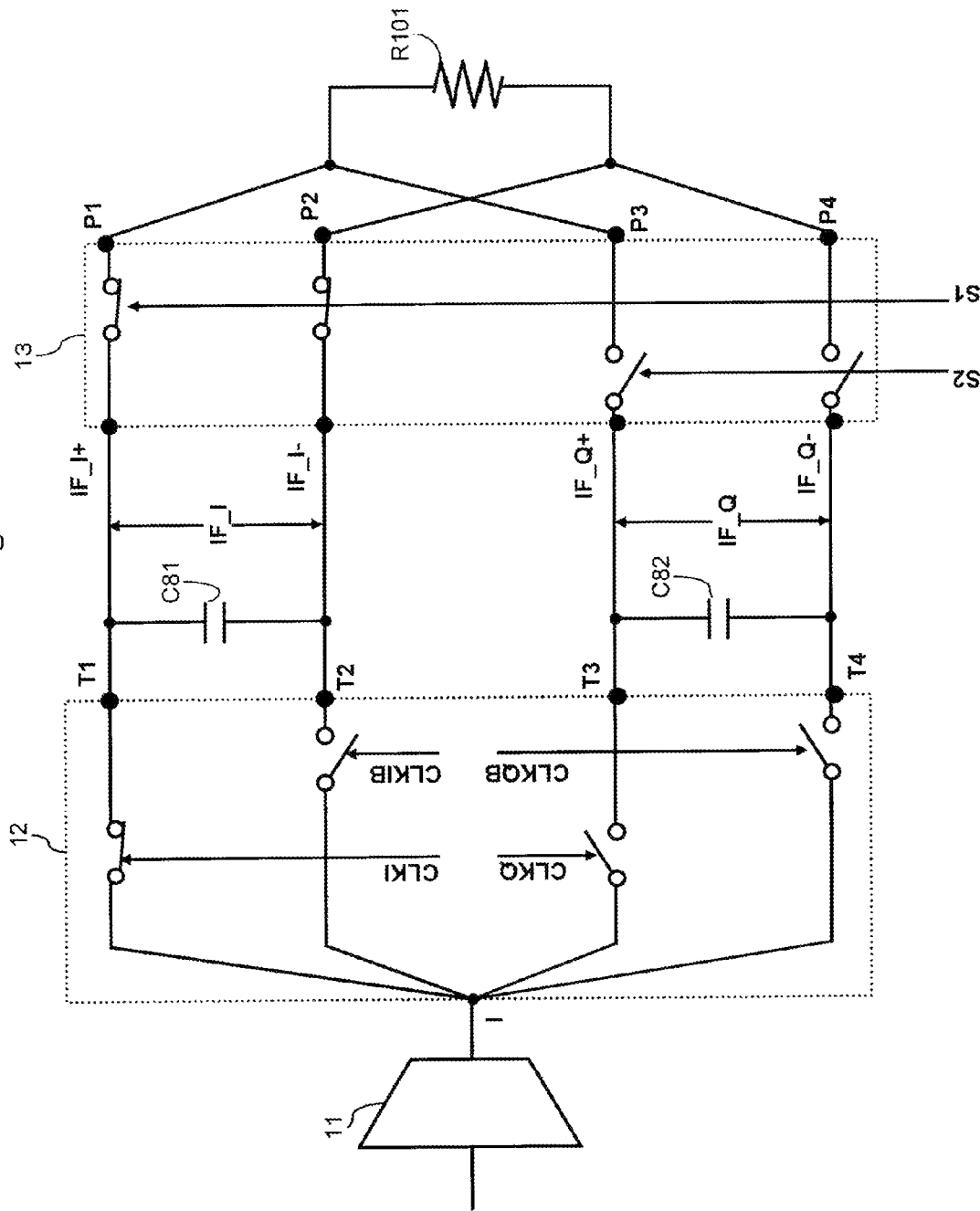
FIG. 14 is a circuit diagram showing the configuration of another orthogonal mixer circuit of the second exemplary embodiment.

FIG. 14 is a circuit diagram showing the second orthogonal mixer circuit of the present exemplary embodiment. Compared to FIG. 12, the orthogonal mixer circuit in FIG. 14 includes load resistor R101 in place of load resistors R81 and R82.

One end of load resistor R101 is connected to output terminals P1 and P3, and the other end of load resistor R101 is connected to output terminals P2 and P4.

In FIG. 14, IF path selection unit 13 switches the connection relationship of the output terminals of RF path selection unit 12 and the output terminals of IF path selection unit 13 such that load resistor R101 is connected in parallel with load capacitor C81 or load capacitor C82 according to selection signal S.

When load resistor R101 is connected in parallel to load capacitor C81, IF signal IF_Q becomes the voltage value that is held in load capacitor C82, and when load resistor R101 is connected in parallel to load capacitor C82, IF signal IF_I becomes the voltage value that is held in load capacitor C81.

By means of the above-described configuration, only one load resistor is needed, and the circuit configuration of orthogonal mixer circuit can be simplified. However, IF path selection unit 13 requires the implementation of discrete time processing.

Typically, the signal band of the input signal that is applied as input to a discrete time processing circuit must be limited to no more than half the sampling frequency. As a result, a prefilter is necessary for limiting the band in the orthogonal mixer circuit.

The third exemplary embodiment is next described.

Figure 15:
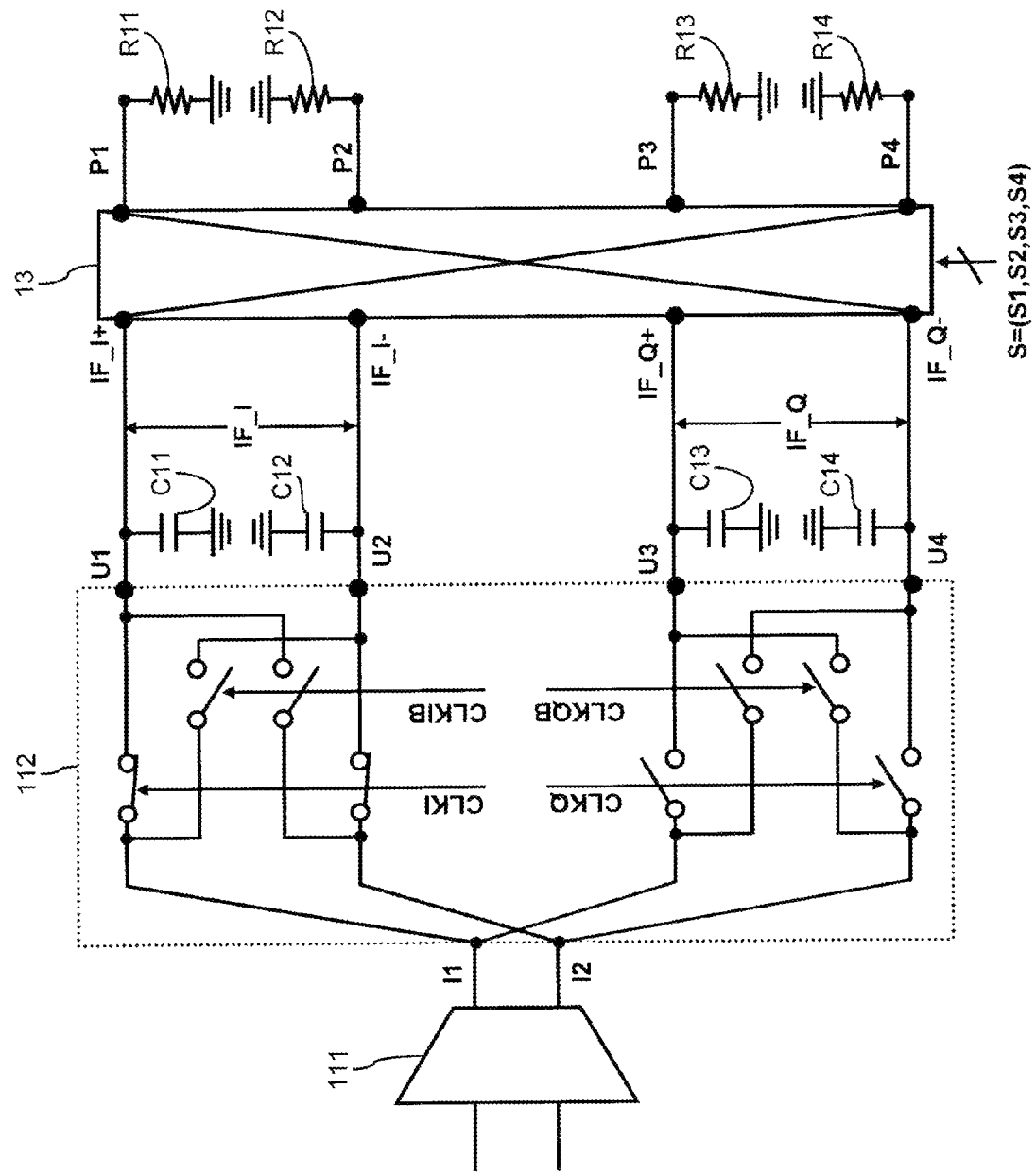
FIG. 15 is a circuit diagram showing the configuration of the orthogonal mixer circuit of the third exemplary embodiment.

FIG. 15 is a circuit diagram showing the configuration of the orthogonal mixer circuit of the present exemplary embodiment. Compared to FIG. 5, the orthogonal mixer circuit in FIG. 15 includes voltage-current conversion unit 111 in place of voltage-current conversion unit 11 and includes RF path selection unit 112 in place of RF path selection unit 12. In addition, voltage-current conversion unit 111 and RF path selection unit 112 differ from voltage-current conversion unit 11 and RF path selection unit 12 in that they include a differential configuration.

An RF signal that is a differential voltage signal is applied as input to voltage-current conversion unit 111. Voltage-current conversion unit 111 converts the RF signal that is a differential signal to a voltage signal and supplies the result from its own output terminal.

RF path selection unit 112 includes input terminals I1 and I2, to which the RF signal that was supplied from voltage-current conversion unit 11 is applied as input, and a plurality of output terminals. In addition, RF path selection unit 112 receives a four-phase clock signal.

The positive-phase signal of the RF signal is applied to input terminal I1, and the negative-phase signal of the RF signal is applied to input terminal I2. In addition, it is assumed hereinbelow that RF path selection unit 112 has four output terminals, these output terminals being referred to as output terminals U1-U4.

RF path selection unit 112 connects input terminals I1 and I2 separately to any two of output terminals U1-U4 in accordance with the state of the four-phase clock signal. Accordingly, RF path selection unit 112 separately supplies a plurality of signals obtained by multiplying each clock signal in the four-phase clock signal by the RF signal from output terminals U1-U4.

More specifically, when clock signal CLKI becomes high level, RF path selection unit 112 connects input terminal I1 to output terminal U1 and connects input terminal I2 to output terminal U2. When clock signal CLKQ becomes high level, RF path selection unit 112 connects input terminal I1 to output terminal U3 and connects input terminal I2 to output terminal U4. When clock signal CLKIB becomes high level, RF path selection unit 112 connects input terminal I1 to output terminal U2 and connects input terminal I2 to output terminal U1. Then, when clock signal CLKQB becomes high level, RF path selection unit 112 connects input terminal I1 to output terminal U4 and connects input terminal I2 to output terminal U3.

According to the present exemplary embodiment, the present orthogonal mixer circuit functions as a double-balanced mixer circuit, whereby even-order distortion of an IF signal or feedthrough of an RF signal or local signal LO can be suppressed.

The fourth exemplary embodiment of the present invention is next described.

Figure 16:
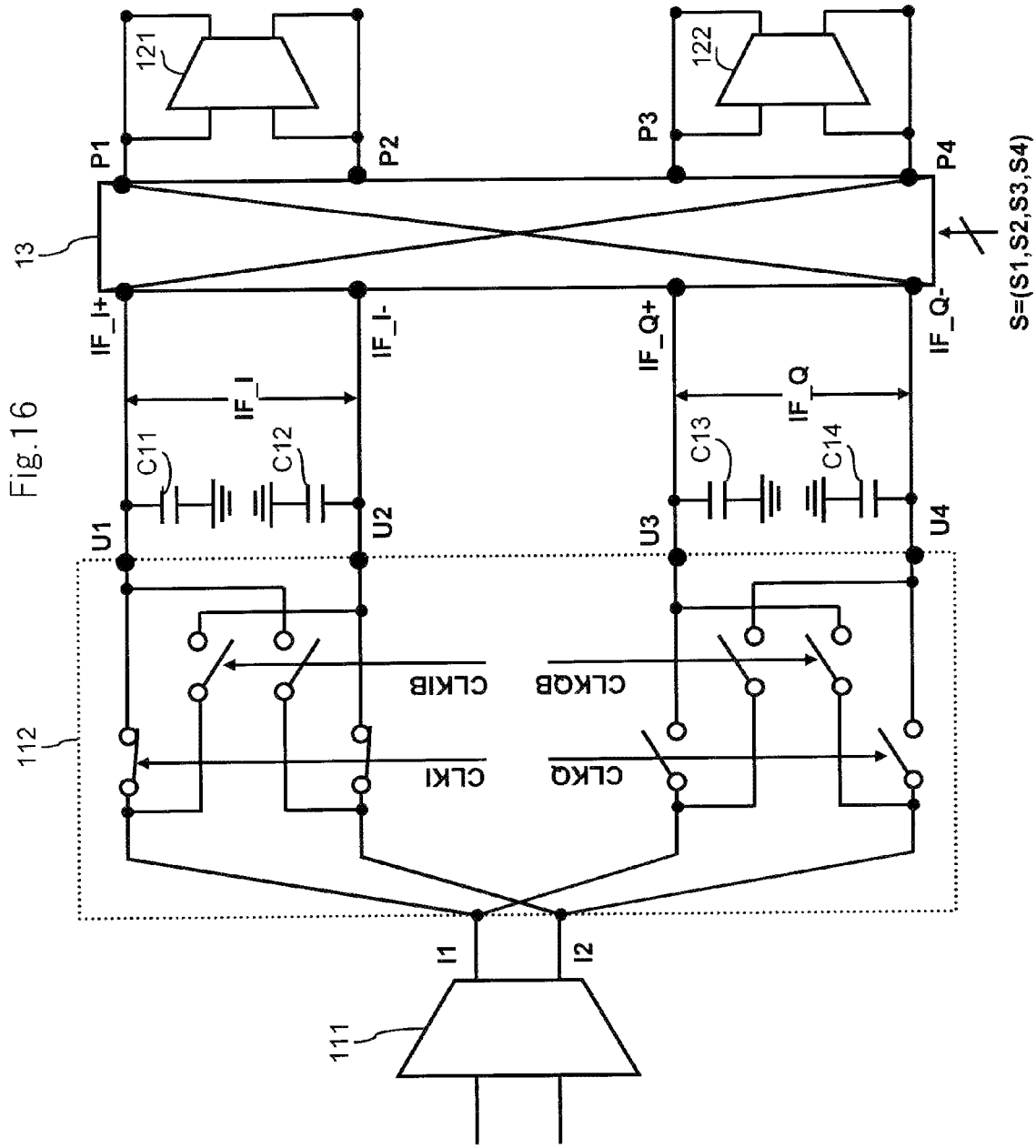
FIG. 16 is a circuit diagram showing the configuration of the orthogonal mixer circuit of the fourth exemplary embodiment.

FIG. 16 is a circuit diagram showing the configuration of the orthogonal mixer circuit of the present exemplary embodiment. In FIG. 16, the orthogonal mixer circuit differs from FIG. 15 in that the second load unit is realized by active loads 121 and 122. In addition, a voltage/current conversion circuit is used as active loads 121 and 122.

The frequency conversion gain of the orthogonal mixer circuit shown in FIG. 15 is proportional to the product of the conversion gain of voltage-current conversion circuit 111 and the load resistance. However, due to variations in, for example, the load resistance in the fabrication process, this frequency/conversion gain is typically difficult to determine accurately. In contrast, the frequency/conversion gain of the orthogonal mixer circuit shown in FIG. 16 is proportional to the ratio of the conversion gain of voltage-current conversion unit 111 and the conversion gain of voltage-current conversion circuits that are used as active loads 121 and 122. As a result, the orthogonal mixer circuit of the present exemplary embodiment has excellent resistance to variations of load in the fabrication process.

The fifth exemplary embodiment of the present invention is next described.

Figure 17:
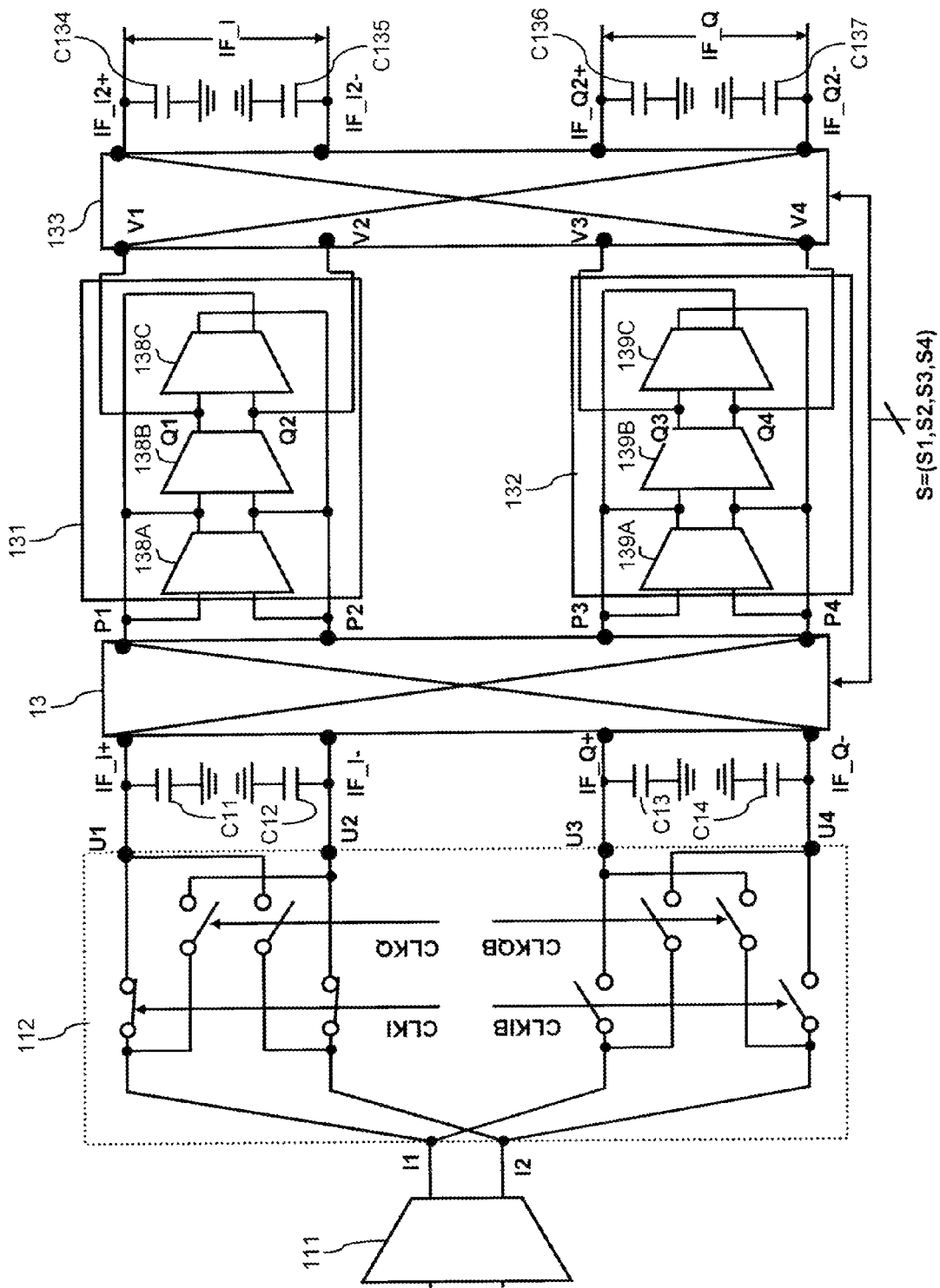
FIG. 17 is a circuit diagram showing the configuration of the orthogonal mixer circuit of the fifth exemplary embodiment.

FIG. 17 is a circuit diagram showing the configuration of the orthogonal mixer circuit of the present exemplary embodiment. Compared to FIG. 15, the orthogonal mixer circuit in FIG. 17 differs in that the second load unit is realized by secondary LPFs 131 and 132 and by the addition of second IF path selection unit 133 and second load capacitors C134-C137.

Secondary LPFs 131 and 132 are secondary low-pass filters that use transimpedance amplifiers, and these secondary LPFs 131 and 132 damp a high frequency band of at least a predetermined Nyquist frequency of the IF signal and supply the result. Secondary LPFs 131 and 132 have a differential configuration.

Secondary LPF 131 includes voltage-current converters 138A-138C that are connected in a series. The two input terminals of the first-stage voltage-current converter 138A are connected to respective output terminals P1 and P2 of IF path selection unit 13. The output terminals of voltage-current converters 138A and 138C are fed back and connected to the input terminal of voltage-current converter 138A, and output terminals Q1 and Q2 of voltage-current converter 138B also serve as the output terminals of secondary LPF 131 and are connected to IF path selection unit 133.

Secondary LPF 132 includes voltage-current converters 139A-139C that are connected in a series. The two input terminals of first-stage voltage-current converter 139A are connected to respective output terminals P3 and P4 of IF path selection unit 13. In addition, the output terminals of voltage-current converters 139A and 139C are fed back and connected to the input terminals of voltage-current converter 139A, and output terminals Q3 and Q4 of voltage-current converter 139B also serve as the output terminals of secondary LPF 132 and are connected to IF path selection unit 133.

Based on the above configuration, the high-frequency band in IF signal IF_I is damped in secondary LPF 131 and the high-frequency band in IF signal IF_Q is damped in secondary LPF 132.

IF path selection unit 133 includes a plurality of input terminals, to which is applied the IF signal that was supplied from IF path selection unit 13, and a plurality of output terminals. In the following description, it is assumed that IF path selection unit 133 has four input terminals and four output terminals. In the following description, the input terminals of IF path selection unit 13 are each referred to as input terminals V1-V4, and the output terminals of IF path selection unit 133 are each referred to as output terminals IF_I2+, IF_I2-, IF_Q2+, and IF_Q2-.

The IF signals supplied from IF path selection unit 13 are each applied to input terminals V1-V4 by way of secondary LPF 131 or 132.

IF path selection unit 133 switches the connection relationship of its own input terminals and output terminals in accordance with selection signal S and supplies the IF signal that was applied as input to each input terminal from the output terminal that is connected to that input terminal. More specifically, IF path selection unit 133 connects each of its own input terminals to its own output terminals without duplication in accordance with the state of selection signal S, whereby IF path selection unit 133 supplies the IF signal that was applied as input to each of its own input terminals from its own output terminal that was connected to that input terminal.

Load capacitors C134-C137 are loads that are connected to the output terminals of IF path selection unit 133 without duplication and are loads for smoothing the IF signal. The reason for introducing load capacitors C134-C137 is that, when secondary LPFs are used to convert an IF signal to a voltage signal, two load capacitors are necessary for one path to smooth the IF signal.

Figure 18:
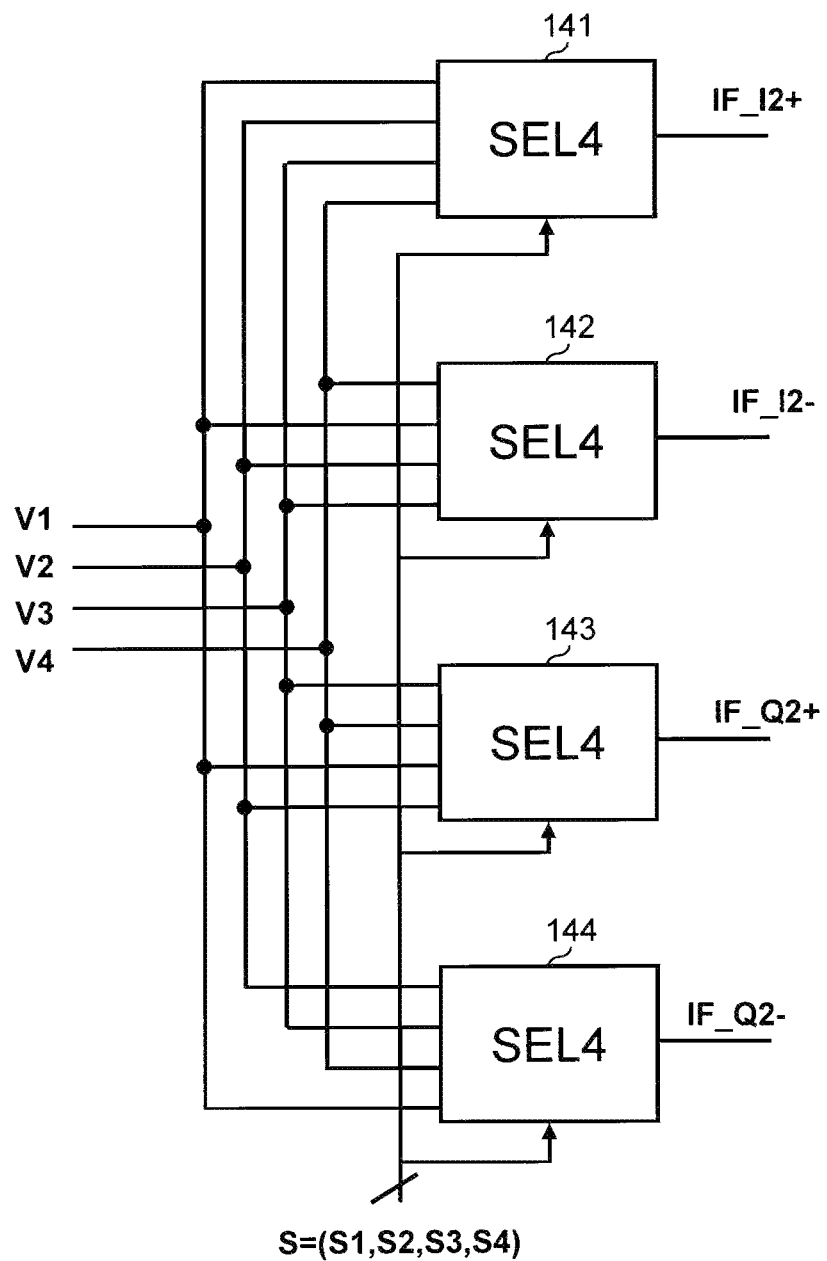
FIG. 18 is a circuit diagram showing an example of the configuration of the second IF path selection unit.

FIG. 18 is a circuit diagram showing an example of the configuration of IF path selection unit 133. In FIG. 18, IF path selection unit 133 includes selection circuits (SEL 4 in FIG. 11A) 141-144 that are multiplexer circuits, similar to IF path selection unit 13 shown in FIG. 11A.

The input terminals of each of selection circuits 141-144 are connected to all of the input terminals of IF path selection unit 133, and the output terminals of each of selection circuits 141-144 are connected to any of the output terminals of IF path selection unit 133 without duplication. In addition, selection signal S is supplied as input to each of selection circuits 141-144.

When individual selection signal S1 is high level, the connection relationship of the input terminals and output terminals is (V1, V2, V3, V4)=(IF_I2+, IF_Q2-, IF_Q2+, IF_I2-); when individual selection signal S2 is high level, the connection relationship is (V1, V2, V3, V4)=(IF_I2-, IF_Q2+, IF_Q2-, IF_Q2+); when individual selection signal S3 is high level, the connection relationship is (V1, V2, V3, V4)= (IF_Q2+, IF_I2-, IF_I2-, IF_Q2-); and when individual selection signal S4 is high level, the connection relationship is (V1, V2, V3, V4)=(IF_Q2-, IF_Q2+, IF_I2-, IF_I2+).

Second IF path selection unit 133 corresponds to the third path selector, and second load capacitors C134-C137 constitute the third load unit. In addition, input terminals V1-V4 correspond to the third input terminals, and output terminals IF_Q2+, IF_I2-, IF_I2+ and IF_Q2- correspond to the fourth output terminals.

According to the present exemplary embodiment, IF path selection unit 133 switches the connection relationship of its own input terminals and output terminals according to selection signal S and supplies the IF signal that is applied as input to each input terminal from the output terminal that is connected to that input terminal. Load capacitors C134-C137 are connected to the output terminals of IF path selection unit 133 and smooth the IF signal.

In this case, the phase errors and amplitude errors that arise from the influence of the variations of secondary LPFs 131 and 132 that are the first load unit that is interposed between IF path selection units 13 and 133 are averaged over time by load capacitors C11-C14 and load capacitor C134 to load capacitor C137, whereby the phase errors and amplitude errors are compensated.

IF path selection unit 133 is able to demodulate (down-convert) an IF signal that has been modulated (up-converted) by IF path selection unit 13 and reproduce a signal of the same frequency as the original signal. Still further, the offset and low-frequency noise that are produced in secondary LPFs 131 and 132 that are interposed between IF path selection units 13 and 133 are modulated (up-converted) by means of selection signal S in IF path selection unit 133.

As a result, the undesirable signal component in the IF signal that is supplied from IF path selection unit 133 can be easily suppressed by, for example, a simple filter, because the frequency of the undesirable signal component such as offset or low-frequency noise is not superposed on the frequency of the desired signal component. Accordingly, the present exemplary embodiment features, in addition to the effect of enabling compensation of phase errors and amplitude errors of IQ signals that arise from the influence of variations, the effect of enabling suppression of deterioration of the signal-to-noise ratio caused by offset or low-frequency noise produced in the second load unit.

Still further, although the second load unit is realized by secondary LPFs in the present exemplary embodiment, the second load unit is not actually limited to secondary LPFs and may be constituted to include a typical filter circuit that damps a predetermined frequency band in the IF signal and supplies the result. For example, the second load unit may be configured using a band-pass filter (BPF), a complex BPF, and a band-elimination filter.

The sixth exemplary embodiment of the present invention is next described.

Figure 19A:
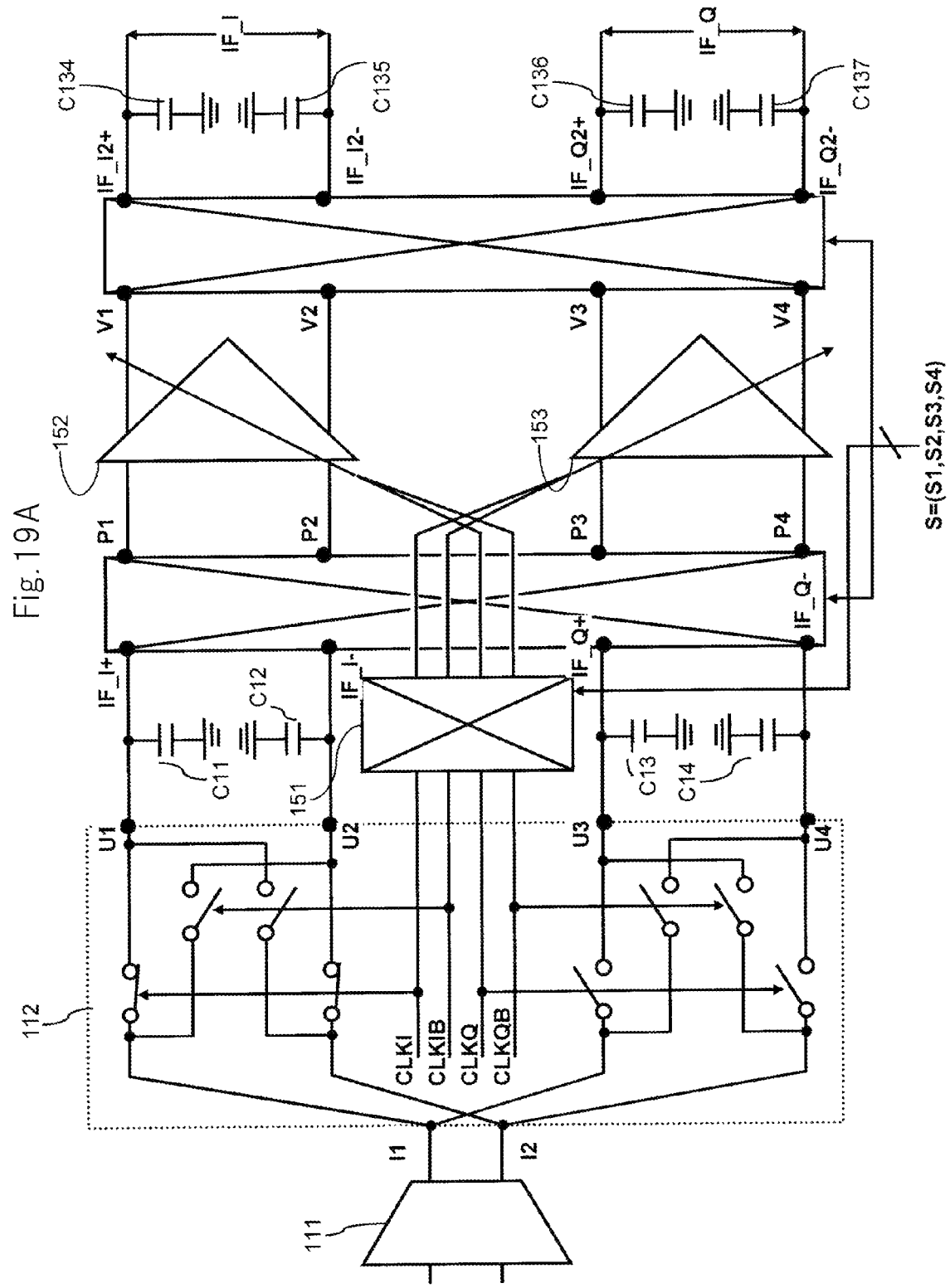
FIG. 19A is a circuit diagram showing the configuration of the orthogonal mixer circuit of the sixth exemplary embodiment.

FIG. 19A is a circuit diagram showing the configuration of the orthogonal mixer circuit of the present exemplary embodiment. The orthogonal mixer circuit shown in FIG. 19A, compared to FIG. 17, differs in that the second load unit is realized by amplifiers 152 and 153 and clock path selector 151 is newly added.

Clock path selector 151 applies any of clock signals CLKI, CLKQ, CLKIB, and CLKQB to amplifiers 152 and 153 in accordance with selection signal S. More specifically, clock path selector 151 applies either of clock signals CLKQ and CLKQB to amplifier 152 and applies either of clock signals CLKI and CLKIB to amplifier 153.

In addition, clock path selector 151 can be realized using the same circuit as the circuit shown in FIG. 11A. The clock signals that are applied as input to clock path selector 151 are binary signals having a value of "0" or "1," and the selection circuit can therefore be constituted by a combination of logic gates.

Amplifiers 152 and 153 have gain that is proportional to the duty ratio of the clock signals that are applied as input from clock path selector 151, and IF signals IF_I and IF_Q are amplified according to this gain and supplied as output.

For example, when the duty ratio of clock signals CLKI and CLKIB is greater than that of clock signals CLKQ and CLKQB, the amplitude of IF signal IF_I is greater than the amplitude of IF signal IF_Q when amplifiers 152 and 153 are not present. When amplifiers 152 and 153 are present, clock signals CLKQ and CLKQB are applied as input to amplifier 152 and clock signals CLKI and CLKIB are applied as input to amplifier 153, whereby the gain of amplifier 152 becomes smaller than the gain of amplifier 153 and amplitude errors can be reduced.

Figure 19B:
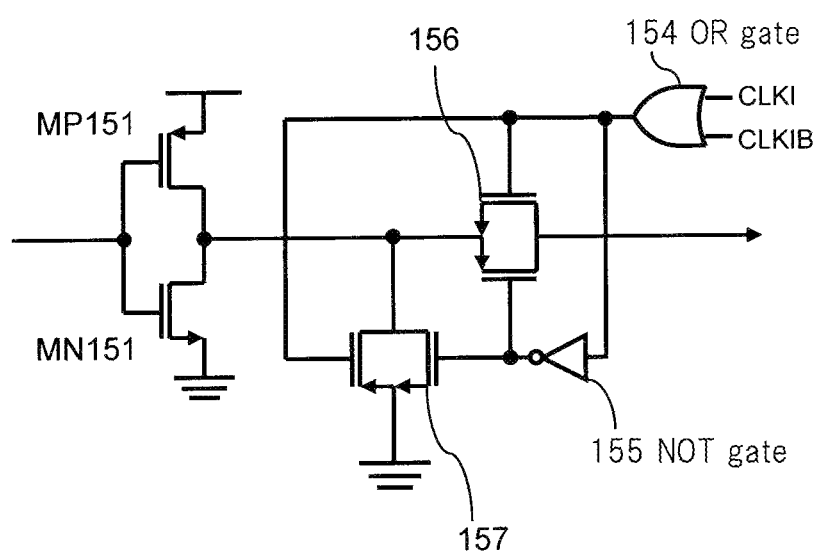
FIG. 19B is a circuit diagram showing an example of the configuration of an amplifier.

FIG. 19B is a circuit diagram showing an example of the actual configuration of amplifier 152. In FIG. 19B, amplifier 152 is realized using a voltage-current conversion circuit.

In FIG. 19B, amplifier 152 includes a CMOS transistor circuit that is composed of PMOS transistor MP151 and NMOS transistor MN151, OR gate 154, NOT gate 155, and transmission gates 156 and 157.

An IF signal is applied as input to a CMOS inverter circuit and a current that is proportional to the voltage value of this IF signal is supplied as output.

OR gate 154 supplies the OR signal of clock signals CLKI and CLKIB. In addition, NOT gate 155 supplies the inverted signal of the OR signal that was supplied from OR gate 154.

The OR signal is applied as input to the NMOS transistor gate of transmission gate 156 and the inverted signal of the OR signal is applied as input to the PMOS transistor gate of transmission gate 156. In addition, the output terminal of transmission gate 156 is the output terminal of amplifier 152. The inverted signal of the OR signal is applied as input to the NMOS transistor gate of transmission gate 156, and the OR signal is applied as input to the PMOS transistor gate of transmission gate 156. The output terminal of transmission gate 156 is connected to a ground point.

In this way, a current that is proportional to the voltage value of the IF signal is supplied from amplifier 152 only when clock signal CLKI or CLKIB is high level, this current otherwise flowing to the ground point. Accordingly, the time average of the current that is supplied as output has voltage-current conversion gain that is proportional to the duty ratio of the OR of clock signals CLKI and CLKIB.

In amplifier 153, clock signals CLKI and CLKIB in FIG. 19B may be replaced by clock signals CLKQ and CLKQB.

The seventh exemplary embodiment of the present invention is next described.

Figure 20:
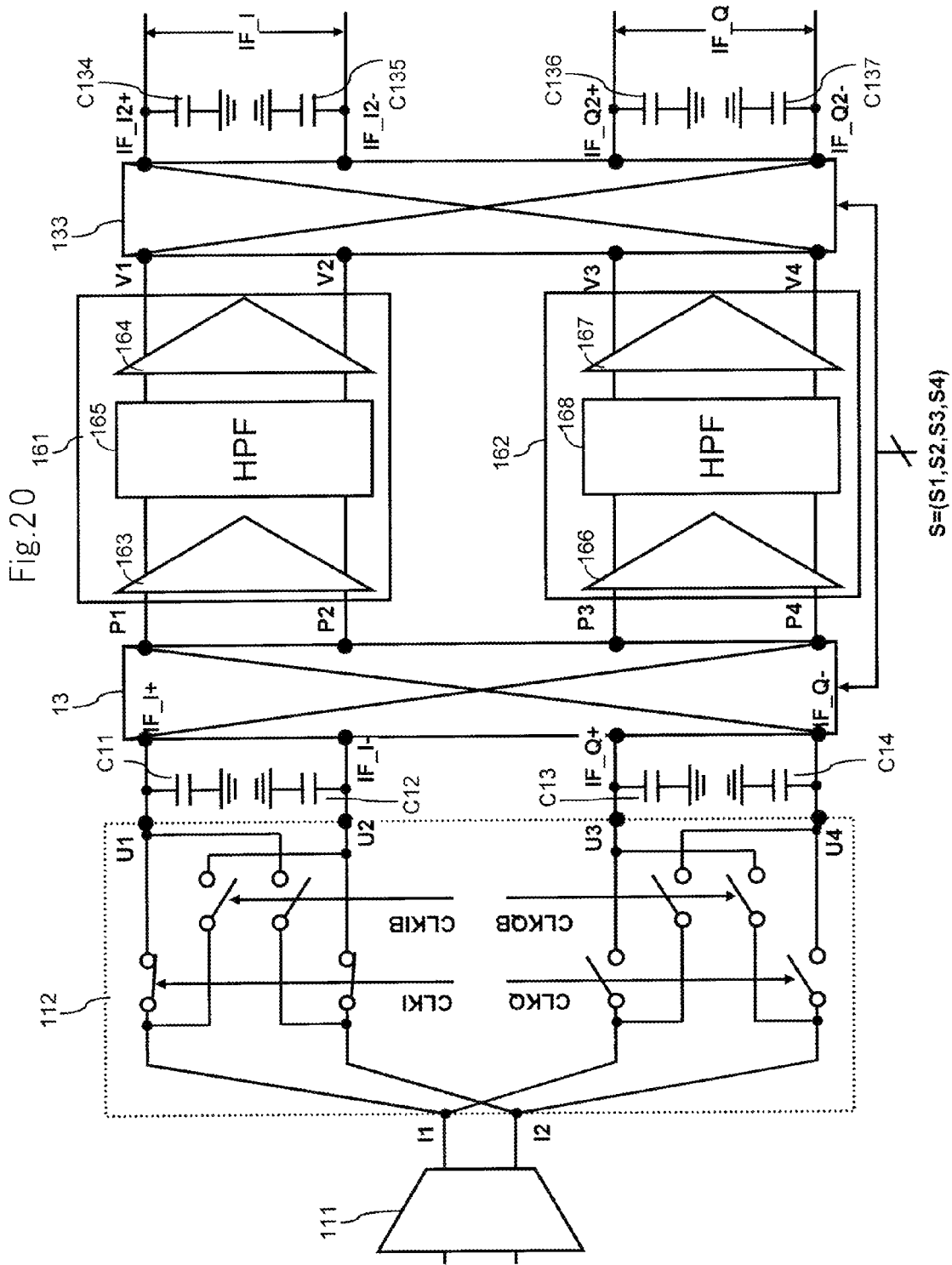
FIG. 20 is a circuit diagram showing the configuration of the orthogonal mixer circuit of the seventh exemplary embodiment.

FIG. 20 is a circuit diagram showing the configuration of the orthogonal mixer circuit of the present exemplary embodiment. Compared to FIG. 18, orthogonal mixer circuit in FIG. 20 differs in that the second load unit is realized by load units 161 and 162 that have HPFs (High-Pass Filters) that damp the low-frequency band of the IF signal.

Load unit 161 includes buffer sections 163 and 164 and HPF (High-Pass Filter) 165 that are connected in a series. Buffer section 163 is provided preceding HPF 165, and buffer section 164 is provided following HPF 165. In addition, buffer sections 163 and 164 and HPF 165 each have a differential configuration.

The two input terminals of buffer section 163 are connected to respective output terminals P1 and P2 of IF path selection unit 13. In addition, the two output terminals of buffer section 164 are connected to respective input terminals V1 and V2 of IF path selection unit 133.

Load unit 162 includes buffer sections 166 and 167 and HPF 168 that are connected in a series. Buffer section 166 is provided preceding HPF 168 and buffer section 167 is provided following HPF 168. Each of buffer sections 166 and 167 and HPF 168 has a differential configuration.

The two input terminals of buffer section 166 are connected to respective output terminals P3 and P4 of IF path selection unit 13. The two output terminals of buffer section 167 are connected to respective input terminals V3 and V4 of IF path selection unit 133.

By means of the above-described configuration, the IF signal that is supplied from IF path selection unit 13 is applied as input to HPF 165 or 168 by way of buffer section 163 or 166. HPFs 165 and 168 damp the low-frequency band that is equal to or lower than the predetermined cut-off frequency in the IF signal and supply the result to IF path selection unit 133 by way of buffer section 164 or 167.

The cut-off frequency of HPFs 165 and 168 are hereinbelow assumed to be on the same order as the frequency of the IF signal. In addition, the period of selection signal S is assumed to be equal to that of the IF signal. Still further, the connection relationship of input terminal IF_I+ and the output terminals of IF path selection unit 13 is assumed to be switched in the order of output terminals P1→P3→P2→P4.

Figure 21:
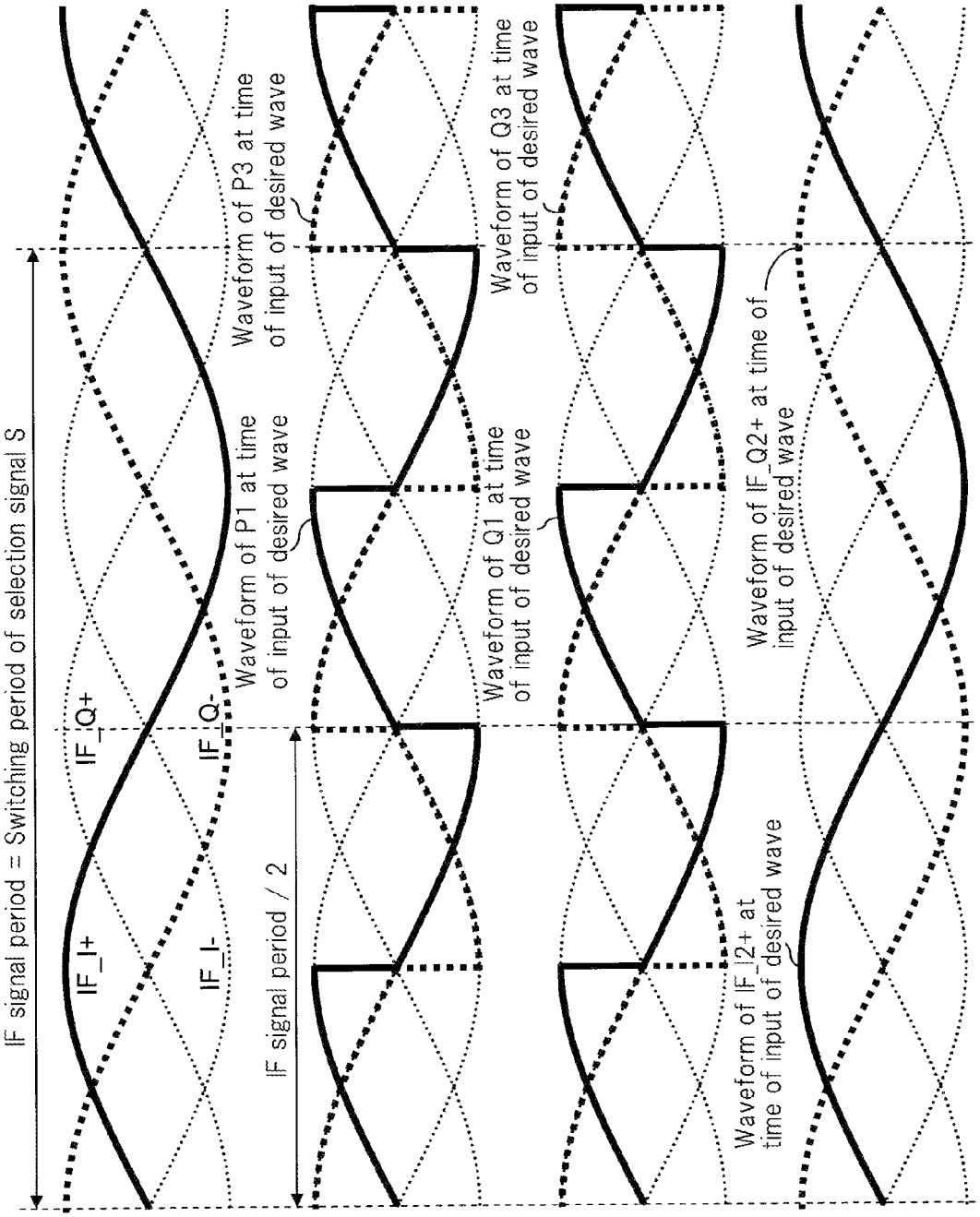
FIG. 21 shows another example of the signal waveform of an IF signal.

FIG. 21 shows the waveforms of the IF signal when a desired wave signal is applied as the IF signal to IF path selection unit 13. More specifically, FIG. 21 shows the waveforms of the IF signal at input terminals IF_I+, IF_I−, IF_Q+, and IF_Q− of IF path selection unit 13; the waveforms of the IF signal at output terminals P1-P4 of IF path selection unit 13; the waveforms of the IF signal at input terminals V1-V4 of IF path selection unit 133; and the waveforms of the IF signal at output terminals IF_I2+, IF_I2−, IF_Q2+, and IF_Q2− of IF path selection unit 133.

As shown in FIG. 21, the desired wave signal is converted to twice the frequency (the higher harmonic component that is greater than this frequency is omitted) at the time of input in IF path selection unit 13 and supplied to HPFs 165 and 168. The cut-off frequency of HPFs 165 and 168 is of the same level as the frequency of the IF signal, and HPFs 165 and 168 therefore supply this desired wave signal without alteration to IF path selection unit 133. The desired wave signal is demodulated to the waveform at the time of input in IF path selection unit 13 in IF path selection unit 133 and supplied as output.

Figure 22:
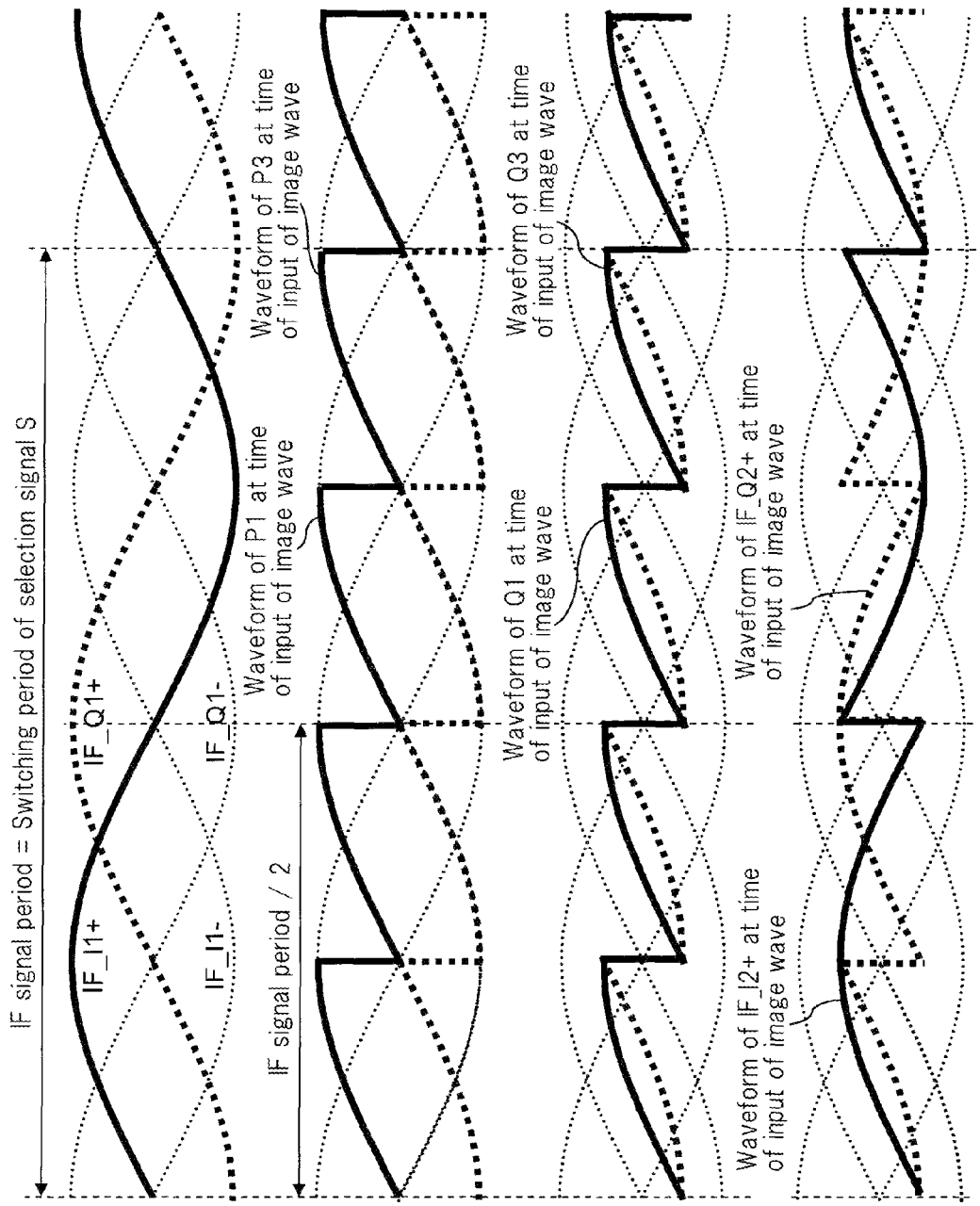
FIG. 22 shows another example of the signal waveform of an IF signal.

FIG. 22 shows waveforms of the IF signal when an image wave signal is applied as the IF signal to IF path selection unit 13. More specifically, FIG. 22 shows waveforms of the IF signal at input terminals IF_I+, IF_I−, IF_Q+, and IF_Q− of IF path selection unit 13, waveforms of the IF signal at output terminals P1-P4 of IF path selection unit 13, waveforms of the IF signal at input terminals V1-V4 of IF path selection unit 133, and waveforms of the IF signal at output terminals IF_I2+, IF_I2−, IF_Q2+, and IF_Q2− of IF path selection unit 133.

An image wave signal is a signal of the same frequency as the desired wave signal and in which the phase relation of I signals and Q signals is reversed. An image wave signal is one cause of the deterioration of the signal-to-noise ratio of IQ signals.

As shown in FIG. 22, the image wave signal is converted in IF path selection unit 13 to a direct-current component and a frequency component that is four times the frequency at the time of input (the higher harmonic component that exceeds this is omitted) and supplied to HPFs 165 and 168. In HPFs 165 and 168, the direct-current component of the image wave signal is damped and an image wave signal having only the quadrupled frequency component is supplied to IF path selection unit 133. The image wave signal is demodulated in IF path selection unit 133. At this time, the direct-current component is damped in HPFs 165 and 168, whereby the amplitude of the demodulated image wave signal, compared to the time of input to IF path selection unit 13, is damped only to the extent of the elimination of the direct-current component.

Accordingly, in the present exemplary embodiment, the orthogonal mixer circuit features, in addition to the effect of enabling averaging of the phase errors and amplitude errors of IQ signals that occur due to the influence of variations of the second load unit and the effect of enabling suppression of deterioration of the signal-to-noise ratio caused by offset and low-frequency noise produced in the second load unit, the added effect of enabling damping of the image wave.

The function of eliminating the image wave signal realized by the present exemplary embodiment can also be incorporated in a digital circuit. In addition, the frequency of selection signal S and the frequency of the IF signal need not be made equal. For example, when the frequency of selection signal S is greater than the frequency f of the IF signal by $\Delta f$, the frequency of the desired wave signal is typically converted to $2f+\Delta f$ in IF path selection unit 13 and the frequency of the image wave signal is converted to $\Delta f$. Accordingly, HPFs 165 and 168 are useful when $\Delta f$ is sufficiently small.

In addition, band elimination filters having a notch in the frequency band of the differential $\Delta f$ between the frequency of selection signal S and the frequency of the IF signal may also be added to load units 161 and 162. In this case, load units 161 and 162 are able to damp the image wave signal by damping the frequency band that contains the frequency that corresponds to the differential $\Delta f$ between the frequency of selection signal S and the frequency of the IF signal.

The configurations shown in the figures in each of the above-described exemplary embodiments are merely examples, and the present invention is not limited to these configurations.

This application claims the benefits of priority based on Japanese Patent Application No. 2009-257795 for which application was submitted on Nov. 11, 2009 and incorporates by citation all of the disclosures of that application.

The invention claimed is:

1. A mixer circuit, comprising:
a voltage-current conversion unit that converts a first signal that comprises a voltage signal to a current signal and supplies a resulting current signal as output;
a first path selector that includes a first input terminal to which is applied as input the first signal that is supplied from said voltage-current conversion unit and a plurality of first output terminals, that switches a connection relationship among said first input terminal and said first output terminals responsive to a state of a signal group that comprises a group of signals included in a four-phase clock signal, and that includes a plurality of second signals that are multiplied by said first signal, and that supplies, separately from each first output terminal, a plurality of third signals obtained by multiplying each of said plurality of second signals by said first signal, said first path selector multiplying said second signals by said first signal by switching the connection relationship of said first input terminal of said first path selector and said first output terminals of said first path selector;
a second path selector coupled to said first path selector that includes a plurality of second input terminals to which each of said third signals is applied and a plurality of second output terminals, that switches a connection relationship among said second input terminals and said second output terminals responsive to a state of a fourth signal that switches the connection relationship of said second input terminals and said second output terminals, and that supplies said third signals that were applied as input to respective second input terminals from the second output terminals that are connected to the second input terminals;
a first load unit that is connected to said first output terminals for smoothing said third signals; and
a second load unit that is connected to said second output terminals for converting said third signals to voltage signals,
wherein said group of signals that switch the connection relationship among said first input terminal and said first output terminals in the first path selector are different from said fourth signal that switch the connection relationship among said second input terminals and said second output terminals in the second path selector.

2. The mixer circuit as set forth in claim 1, wherein said first output terminals comprise four terminals and said state of a signal group comprises four states.

3. The mixer circuit as set forth in claim 2, wherein said second signals have a duty ratio of 25% and comprise four binary signals or inverted signals of the binary signals in which phases of each signal differ by 90 degrees, said binary signals comprising signals including two values each being mapped to each of an on-state and an off-state of switches of the mixer circuit.

4. The mixer circuit as set forth in claim 1, wherein a number of states of said fourth signal is equal to a number of said second output terminals,
wherein said second load unit comprises a plurality of loads that are each connected to a respective one of said second output terminals, and
wherein said second path selector connects each of said second output terminals to one of said first output terminals without duplication in accordance with the state of said fourth signal such that said second path selector connects each of said second input terminals of the said second path selector to a difference output terminal of said second path selector.

5. The mixer circuit as set forth in claim 4, wherein the state of said fourth signal transitions in a predetermined order.

6. The mixer circuit as set forth in claim 4, wherein the state of said fourth signal transitions in fixed time intervals.

7. The mixer circuit as set forth in claim 4, wherein said second output terminals comprise four terminals and said state of said fourth signal comprises four states.

8. The mixer circuit as set forth in claim 7, wherein said fourth signal has a duty ratio of 25% and comprises four binary signals or inverted signals of the binary signals in which phases of each signal differ by 90 degrees, said binary signals comprising signals including two values each being mapped to each of an on-state and an off-state of switches of the mixer circuit.

9. The mixer circuit as set forth in claim 8, wherein a frequency of said fourth signal is no greater than a frequency of said third signals.

10. The mixer circuit as set forth in claim 1, wherein said first load unit includes capacitance elements.

11. The mixer circuit as set forth in claim 1, further comprising:
a third path selector that comprises a plurality of third output terminals to which are applied the third signals that are supplied from said second output terminals and a plurality of third output terminals, that switches a connection relationship of said third input terminals and said third output terminals in accordance with said fourth signal, and that supplies third signals that were applied as input to each third input terminal from the second output terminals that are connected to the third input terminals; and
a third load unit that is connected to said third output terminals for smoothing said third signals.

12. The mixer circuit as set forth in claim 11, wherein said third load unit includes a capacitance element.

13. The mixer circuit as set forth in claim 11, wherein said third signal comprises a frequency band signal, and
wherein said second load unit includes a low-pass filter that damps a high-frequency band of said third signals.

14. The mixer circuit as set forth in claim 11, wherein said third signal comprises a frequency band signal, and
wherein said second load unit includes a high-pass filter that damps a low-frequency band of said third signals.

15. The mixer circuit as set forth in claim 11, wherein said second load unit includes an amplifier in which a time average of a current that is supplied as an output includes a voltage-current conversion gain that is proportional to a duty ratio of said second signal.

16. The mixer circuit as set forth in claim 1, wherein the first load unit comprises a plurality of first load capacitors and the second load unit comprises a plurality of second load capacitors that are connected in parallel to the plurality of first load capacitors through the second path selector.

17. A control method of a mixer circuit that includes a voltage-current conversion unit that converts a first signal that includes a voltage signal to a current signal and supplies a resulting current signal, a first path selector that includes a first input terminal to which is applied as input a first signal that is supplied from said voltage-current conversion unit and first output terminals that supply a plurality of third signals obtained by multiplying each of a plurality of second signals by said first signal, a second path selector coupled to said first selector that comprises a plurality of second input terminals to which are applied each of said third signals and a plurality of second output terminals, a first load unit that is connected to said first output terminals for smoothing said third signals, and a second load unit that is connected to said second output terminals for converting said third signals to voltage signals, said method including:
a first switching of switching a connection relationship among said first input terminal and said first output terminals responsive to a state of a signal group that comprises a group of signals included in a four-phase clock signal, and that includes said plurality of second signals and supplying, separately from each first output terminal, a plurality of third signals obtained by multiplying each of said second signals by said first signal, said first path selector multiplying said second signals by said first signal by switching the connection relationship of said first input terminal and said first output terminals; and
a second switching of switching a connection relationship among said second input terminals and said second output terminals responsive to a state of a fourth signal that switches the connection relationship among said second input terminals and said second output terminals and supplying third signals that were received as input in each of second input terminals from second output terminals that are connected to the second input terminals,
wherein said group of signals that switch the connection relationship among said first input terminal and said first output terminals in the first path selector are different from said fourth signal that switch the connection relationship among said second input terminals and said second output terminals in the second path selector.

18. The method as set forth in claim 17, further comprising:
modulating, in said second switching, said third signals based on said fourth signal and the result then supplied as output;
damping a predetermined frequency band in said third signals that were modulated and supplied; and
based on said fourth signal, demodulating said third signals in which a predetermined frequency band was damped.

19. The method as set forth in claim 18, wherein, as said predetermined frequency band in said damping, a frequency band that includes a frequency corresponding to a differential of a frequency of said third signals and a frequency of said fourth signal is damped.

20. The method as set forth in claim 19, wherein, as said predetermined frequency band in said damping, a frequency band no greater than a predetermined cut-off frequency is damped.

* * * * *